United States Patent [19]
Abele

[11] Patent Number: 5,119,057
[45] Date of Patent: Jun. 2, 1992

[54] OPTIMUM DESIGN OF TWO-DIMENSIONAL PERMANENT MAGNETS

[75] Inventor: Manlio G. Abele, New York, N.Y.
[73] Assignee: New York University, New York, N.Y.
[21] Appl. No.: 424,162
[22] Filed: Oct. 19, 1989
[51] Int. Cl.⁵ .............................................. H01F 7/02
[52] U.S. Cl. .................................... 335/304; 335/306
[58] Field of Search ................. 335/302, 306, 301, 304

[56] References Cited

U.S. PATENT DOCUMENTS

| | | | |
|---|---|---|---|
| 3,205,415 | 9/1965 | Seki et al. | 335/301 X |
| 3,768,054 | 10/1973 | Neugebauer | 335/304 |
| 4,647,887 | 3/1987 | Leupold | 335/306 X |

OTHER PUBLICATIONS

M. G. Abele, Linear Theory of Yokeless Permanent Magnets, EMMA '89, Rimini, Italy, 1989.
M. G. Abele, Design of Yokeless Rare Earth Magnets for NMR Medical Applications, Proceedings of 10th Intn'l Workshop on Rare Earth Magnets, Kyoto, 1989, pp. 121-130.
M. G. Abele, Some Considerations about Permanent Magnet Design for NMR, TR-13, New York University, NY, NY Feb. 1, 1986.
M. G. Abele, Design of Two-Dimensional Magnets without Magnetic Yoke, TR-15, New York University, NY, NY Mar. 1, 1987.
M. G. Abele, Yokeless Permanent Magnets, TR-14, New York University, NY, NY. Nov. 1, 1986.
M. G. Abele, Three-Dimensional Design of a Permanent Magnet, TR-16, New York University, NY, NY. Jun. 1, 1987.
M. G. Abele, Use of Materials of Different Magnetic Permabilities in Permanent Magnets. TR-17, New York University, NY, NY. Aug. 1, 1987.
M. G. Abele. Properties of the Magnetic Field in Yokeless Permanent Magnets. TR-17, New York University, NY, NY. Aug. 1, 1987.
M. G. Abele. Generation of a Uniform Field in a Yokeless Permanent Magnet for NMR Clinical Applicatons. TR-19, New York University, NY, NY. Jul. 1, 1988.
M. G. Abele, Geometric Invariance of Yokeless Two Dimensional Magnets. TR-20, New York University, NY, NY. Mar. 1, 1989.

*Primary Examiner*—George Harris
*Attorney, Agent, or Firm*—Rosen, Dainow & Jacobs

[57] ABSTRACT

A permanent magnet structure having at least one loop of circulating flux comprises a first and second plurality of uniformly magnetized prismatic magnetic material sections forming a polygonal shaped cavity and having a point F positioned along a zero equipotential base line joining two vertices within the cavity, that point being the reference for a figure of merit M corresponding to a maximum field strength and a minimum ratio of the value of the area of magnetized material to the area of the cavity. The first plurality of sections totally define the cavity and have their respective remanences aligned to result in a flux passing orthogonally through the base line. The second plurality of section is oriented with respect to their respective remanences and the first sections so as to confine the flux within the cavity. A third plurality of nonmagnetized magnetic sections encloses the base line and borders the first sections for providing an inductive path to channel the flux and close the loop.

10 Claims, 37 Drawing Sheets

| ni | n=3 | | n=4 | | n=5 | | n=6 | | n=7 | | n=8 | |
|---|---|---|---|---|---|---|---|---|---|---|---|---|
| | K | M | K | M | K | M | K | M | K | M | K | M |
| 1 | 0.500 | 0.083 | 0.293 | 0.086 | 0.191 | 0.069 | 0.134 | 0.054 | 0.099 | 0.042 | 0.076 | 0.034 |
| 2 | 1.000 | 0.067 | 0.586 | 0.114 | 0.382 | 0.109 | 0.268 | 0.092 | 0.198 | 0.076 | 0.152 | 0.062 |
| 3 | 1.500 | 0.036 | 0.879 | 0.110 | 0.573 | 0.128 | 0.402 | 0.118 | 0.297 | 0.102 | 0.228 | 0.086 |
| 4 | 2.000 | 0.016 | 1.172 | 0.092 | 0.764 | 0.131 | 0.536 | 0.133 | 0.396 | 0.120 | 0.304 | 0.105 |
| 5 | 2.500 | 0.006 | 1.464 | 0.069 | 0.955 | 0.124 | 0.670 | 0.140 | 0.495 | 0.133 | 0.381 | 0.120 |
| 6 | 3.000 | 0.002 | 1.757 | 0.049 | 1.146 | 0.112 | 0.804 | 0.140 | 0.594 | 0.141 | 0.457 | 0.132 |
| 7 | 3.500 | 0.001 | 2.050 | 0.033 | 1.337 | 0.097 | 0.938 | 0.135 | 0.693 | 0.145 | 0.533 | 0.140 |
| 8 | | | 2.343 | 0.022 | 1.528 | 0.081 | 1.072 | 0.128 | 0.792 | 0.146 | 0.609 | 0.145 |
| 9 | | | 2.636 | 0.014 | 1.719 | 0.067 | 1.206 | 0.118 | 0.891 | 0.144 | 0.685 | 0.149 |
| 10 | | | 2.929 | 0.008 | 1.910 | 0.053 | 1.340 | 0.107 | 0.990 | 0.139 | 0.761 | 0.150 |
| 11 | | | 3.222 | 0.005 | 2.101 | 0.042 | 1.474 | 0.096 | 1.089 | 0.133 | 0.837 | 0.149 |
| 12 | | | | | 2.292 | 0.033 | 1.608 | 0.085 | 1.188 | 0.126 | 0.913 | 0.147 |
| 13 | | | | | 2.483 | 0.025 | 1.742 | 0.074 | 1.287 | 0.118 | 0.990 | 0.143 |
| 14 | | | | | 2.674 | 0.019 | 1.876 | 0.064 | 1.386 | 0.110 | 1.066 | 0.139 |
| 15 | | | | | 2.865 | 0.014 | 2.010 | 0.055 | 1.485 | 0.101 | 1.142 | 0.134 |
| 16 | | | | | 3.056 | 0.011 | 2.144 | 0.047 | 1.584 | 0.093 | 1.218 | 0.128 |
| 17 | | | | | | | 2.278 | 0.039 | 1.684 | 0.084 | 1.294 | 0.122 |
| 18 | | | | | | | 2.412 | 0.033 | 1.783 | 0.076 | 1.370 | 0.115 |
| 19 | | | | | | | 2.546 | 0.028 | 1.882 | 0.069 | 1.446 | 0.109 |
| 20 | | | | | | | 2.679 | 0.023 | 1.981 | 0.061 | 1.522 | 0.102 |

*FIG. 5*

```
C>DESIGN
        4 SIDES:
    1     .0000  1.0000
    2   -1.0000   .0000
    3     .0000  -.5000
    4    1.0000   .0000
 0.3
  K =  3.000000E-01
 SIDE  1  U =  - .714   .714
 SIDE  2  U =  - .286  -.571
 SIDE  3  U =    .286  -.571
 SIDE  4  U =    .714   .714
 SIDE  1  T =  -1.546  -.125
 SIDE  2  T =    .000  -.657
 SIDE  3  T =   1.546  -.125
 SIDE  4  T =    .000  1.422
  AREA OF CAVITY          1.500000
  AREA OF MAGNETIC MATERIAL   1.744935
  FIGURE OF MERIT      7.736680E-02
```

*FIG. 8*

C > DESIGN

```
        4 SIDES:
      1      .0000   1.0000
      2    -1.0000    .0000
      3      .0000   -.5000
      4     1.0000    .0000
SIDE  1  U = -1.038  1.187
SIDE  2  U =  -.633 -1.117
SIDE  3  U =   .633 -1.117
SIDE  4  U =  1.038  1.187
SIDE  1  T = -1.750  -.134
SIDE  2  T =   .000  -.904
SIDE  3  T =  1.750  -.134
SIDE  4  T =   .000  1.529
  AREA OF CAVITY           1.500000
  AREA OF MAGNETIC MATERIAL     4.745927
  FIGURE OF MERIT          1.100206E-01
```

F I G. 12
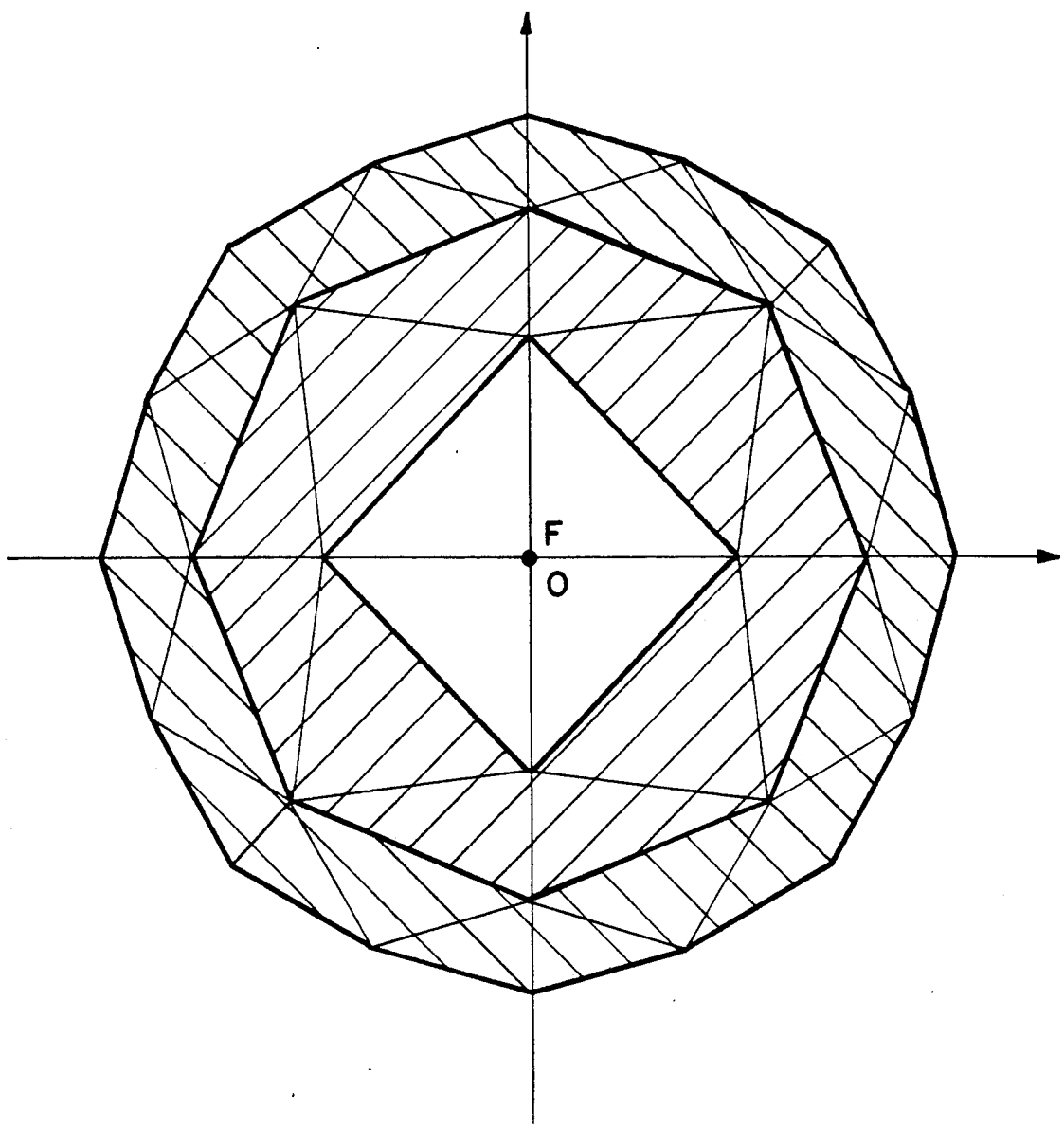

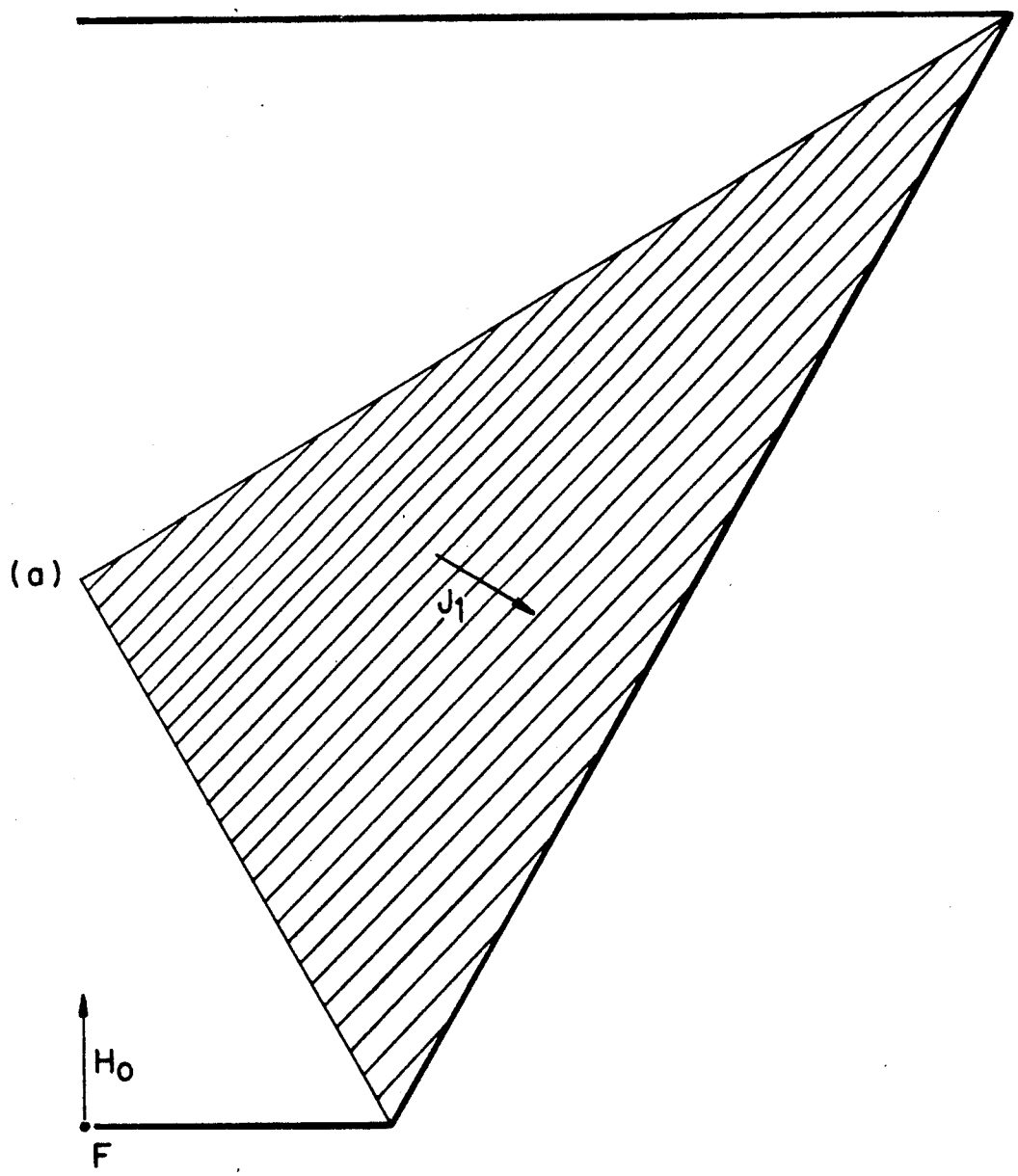

C>

| TRIANGLE | | K=0.5 M | FX=0 |
|---|---|---|---|
| Fy | YOKELESS | YOKED | |
| -0.50 | 0.0714 | 0.06250 | |
| -0.49 | 0.0718 | 0.06271 | |
| -0.48 | 0.0722 | 0.06292 | |
| -0.47 | 0.0726 | 0.06312 | |
| -0.46 | 0.0730 | 0.06333 | |
| -0.45 | 0.0734 | 0.06354 | |
| -0.44 | 0.0738 | 0.06375 | |
| -0.43 | 0.0742 | 0.06396 | |
| -0.42 | 0.0746 | 0.06416 | |
| -0.41 | 0.0749 | 0.06437 | |
| -0.40 | 0.0753 | 0.06458 | |
| -0.39 | 0.0757 | 0.06478 | |
| -0.38 | 0.0760 | 0.06499 | |
| -0.37 | 0.0764 | 0.06519 | |
| -0.36 | 0.0767 | 0.06539 | |
| -0.35 | 0.0770 | 0.06560 | |
| -0.34 | 0.0774 | 0.06580 | |
| -0.33 | 0.0777 | 0.06600 | |
| -0.32 | 0.0780 | 0.06620 | |
| -0.31 | 0.0783 | 0.06640 | |
| -0.30 | 0.0786 | 0.06660 | |
| -0.29 | 0.0789 | 0.06680 | |
| -0.28 | 0.0792 | 0.06699 | |
| -0.27 | 0.0795 | 0.06718 | |
| -0.26 | 0.0797 | 0.06738 | |
| -0.25 | 0.0800 | 0.06757 | |
| -0.24 | 0.0803 | 0.06776 | |
| -0.23 | 0.0805 | 0.06794 | |
| -0.22 | 0.0807 | 0.06813 | |
| -0.21 | 0.0810 | 0.06831 | |
| -0.20 | 0.0812 | 0.06849 | |
| -0.19 | 0.0814 | 0.06867 | |
| -0.18 | 0.0816 | 0.06885 | |
| -0.17 | 0.0818 | 0.06902 | |
| -0.16 | 0.0819 | 0.06919 | |
| -0.15 | 0.0821 | 0.06936 | |
| -0.14 | 0.0823 | 0.06953 | |
| -0.13 | 0.0824 | 0.06969 | |
| -0.12 | 0.0825 | 0.06985 | |
| -0.11 | 0.0827 | 0.07000 | |
| -0.10 | 0.0828 | 0.07015 | |
| -0.09 | 0.0829 | 0.07030 | |
| -0.08 | 0.0830 | 0.07044 | |
| -0.07 | 0.0831 | 0.07058 | |
| -0.06 | 0.0831 | 0.07072 | |
| -0.05 | 0.0832 | 0.07085 | |
| -0.04 | 0.0832 | 0.07098 | |
| -0.03 | 0.0833 | 0.07110 | |
| -0.02 | 0.0833 | 0.07121 | |
| -0.01 | 0.0833 | 0.07132 | |
| 0.00 | 0.0833 | 0.07143 | |
| 0.01 | 0.0833 | 0.07153 | |
| 0.02 | 0.0833 | 0.07162 | |

FIG. 22

| K | YOKELESS | YOKED | HYBRID |
|---|---|---|---|
| 0.53 | 0.104450 | 0.190410 | 0.172454 |
| 0.54 | 0.105115 | 0.189925 | 0.171969 |
| 0.55 | 0.105697 | 0.189262 | 0.171346 |
| 0.56 | 0.106187 | 0.188420 | 0.170585 |
| 0.57 | 0.106581 | 0.187399 | 0.169685 |
| 0.58 | 0.106871 | 0.186200 | 0.168646 |
| 0.59 | 0.107049 | 0.184823 | 0.167469 |
| 0.60 | 0.107111 | 0.183268 | 0.166154 |
| 0.61 | 0.107049 | 0.181537 | 0.164700 |
| 0.62 | 0.106856 | 0.179629 | 0.163108 |
| 0.63 | 0.106529 | 0.177546 | 0.161377 |
| 0.64 | 0.106060 | 0.175289 | 0.159508 |
| 0.65 | 0.105446 | 0.172860 | 0.157500 |
| 0.66 | 0.104682 | 0.170259 | 0.155354 |
| 0.67 | 0.103765 | 0.167489 | 0.153069 |
| 0.68 | 0.102692 | 0.164551 | 0.150646 |
| 0.69 | 0.101460 | 0.161447 | 0.148085 |
| 0.70 | 0.100068 | 0.158180 | 0.145385 |
| 0.71 | 0.098516 | 0.154750 | 0.142546 |
| 0.72 | 0.096803 | 0.151160 | 0.139569 |
| 0.73 | 0.094930 | 0.147413 | 0.136454 |
| 0.74 | 0.092897 | 0.143512 | 0.133200 |
| 0.75 | 0.090707 | 0.139458 | 0.129808 |
| 0.76 | 0.088363 | 0.135255 | 0.126277 |
| 0.77 | 0.085867 | 0.130905 | 0.122608 |
| 0.78 | 0.083222 | 0.126412 | 0.118800 |
| 0.79 | 0.080434 | 0.121778 | 0.114854 |
| 0.80 | 0.077506 | 0.117008 | 0.110769 |
| 0.81 | 0.074444 | 0.112104 | 0.106546 |
| 0.82 | 0.071253 | 0.107070 | 0.102185 |
| 0.83 | 0.067940 | 0.101857 | 0.097685 |
| 0.84 | 0.064508 | 0.096634 | 0.093046 |
| 0.85 | 0.060967 | 0.091232 | 0.088269 |
| 0.86 | 0.057323 | 0.085721 | 0.083354 |
| 0.87 | 0.053582 | 0.080102 | 0.078300 |
| 0.88 | 0.049753 | 0.074380 | 0.073108 |
| 0.89 | 0.045843 | 0.068560 | 0.067777 |
| 0.90 | 0.041860 | 0.062649 | 0.062308 |
| 0.91 | 0.037812 | 0.056651 | 0.056700 |
| 0.92 | 0.033709 | 0.050574 | 0.050954 |
| 0.93 | 0.029559 | 0.044424 | 0.045070 |
| 0.94 | 0.025371 | 0.038208 | 0.039047 |
| 0.95 | 0.021155 | 0.031935 | 0.032885 |
| 0.96 | 0.016920 | 0.025611 | 0.026585 |
| 0.97 | 0.012676 | 0.019246 | 0.020147 |
| 0.98 | 0.008435 | 0.012849 | 0.013570 |
| 0.99 | 0.004206 | 0.006431 | 0.006854 |
| 1.00 | 0.000000 | 0.000000 | 0.000000 |

FIG. 30

| | | | |
|---|---|---|---|
| .590 | .107049 | .123995 | .074431 |
| .600 | .107111** | .124281 | .073846 |
| .610 | .107049 | .124433 | .073200 |
| .620 | .106856 | .124443** | .072492 |
| .630 | .106529 | .124304 | .071723 |
| .640 | .106060 | .124007 | .070892 |
| .650 | .105446 | .123547 | .070000 |
| .660 | .104682 | .122915 | .069046 |
| .670 | .103765 | .122108 | .068031 |
| .680 | .102692 | .121119 | .066954 |
| .690 | .101460 | .119944 | .065815 |
| .700 | .100068 | .118580 | .064615 |
| .710 | .098516 | .117023 | .063354 |
| .720 | .096803 | .115273 | .062031 |
| .730 | .094930 | .113327 | .060646 |
| .740 | .092897 | .111185 | .059200 |
| .750 | .090707 | .108847 | .057692 |
| .760 | .088363 | .106315 | .056123 |
| .770 | .085867 | .103591 | .054492 |
| .780 | .083222 | .100676 | .052800 |
| .790 | .080434 | .097574 | .051046 |
| .800 | .077506 | .094289 | .049231 |
| .810 | .074444 | .090824 | .047354 |
| .820 | .071253 | .087185 | .045415 |
| .830 | .067940 | .083377 | .043415 |
| .840 | .064508 | .079405 | .041354 |
| .850 | .060967 | .075276 | .039231 |
| .860 | .057323 | .070998 | .037046 |
| .870 | .053582 | .066575 | .034800 |
| .880 | .049753 | .062017 | .032492 |
| .890 | .045843 | .057331 | .030123 |
| .900 | .041860 | .052526 | .027692 |
| .910 | .037812 | .047609 | .025200 |
| .920 | .033709 | .042591 | .022646 |
| .930 | .029559 | .037480 | .020031 |
| .940 | .025371 | .032286 | .017354 |
| .950 | .021155 | .027020 | .014616 |
| .960 | .016920 | .021693 | .011816 |
| .970 | .012676 | .016315 | .008954 |
| .980 | .008435 | .010899 | .006031 |
| .990 | .004206 | .005456 | .003046 |

FIG. 32

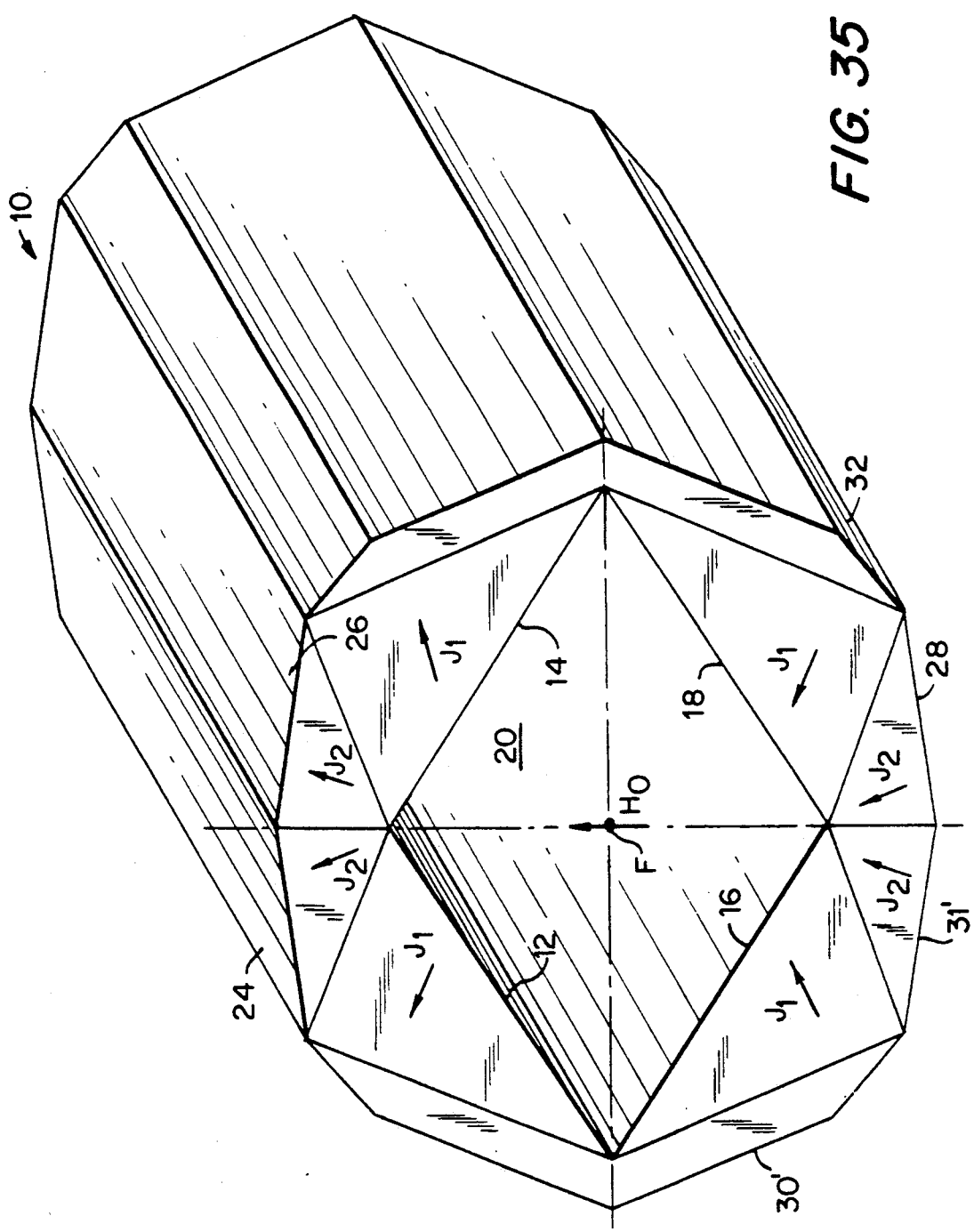

OPTIMUM DESIGN OF TWO-DIMENSIONAL PERMANENT MAGNETS

FIELD OF THE INVENTION

The present invention relates generally to permanent magnet structures and particularly to a method for constructing a permanent magnet structure with a cavity utilizing properties of both yoke and yokeless structures.

BACKGROUND OF THE INVENTION

Large scale permanent magnet with central cavities are useful for magnetic resonance imaging and other applications. The costs of manufacturing such a magnet for a given field strength, particularly at the high end, are extreme. The use of superconductivity to produce desired field strengths is also less desirable than permanent magnets due to the more complex physical requirements involved in such structures. In designing a permanent magnet for use in magnetic resonance imaging, dimensioning a shape for practical use in a surgical suite or hospital environment should be of prime concern.

A basic requirement of the design of a permanent magnet is the efficient use of the energy stored within the magnetized material. In general, the design should be aimed at achieving the desired value of the intensity within the cavity of the magnet with a minimum volume and weight of the magnetized material.

Permanent magnets can be classified in two categories: yokeless magnets where the magnetic structure is designed in such a way that the field is confined within the magnet without the need of a high magnetic permeability yoke, and yoked magnets where the magnetic material is used to generate the desired field within the region of interest and the field confinement is achieved with an external yoke.

Yokeless permanent magnets can be designed with magnetic materials which have a quasi-linear demagnetization characteristic with a slope close to that of air. In this case the magnetic structures are transparent to the field generated by other sources. This is an important property of the yokeless structures, which allows the designer to increase the strength of the field within the cavity by superimposing the fields generated by concentric magnets.

Yoked permanent magnets, on the other hand, are shielded from external sources by the same yoke which confines the field of the magnet. As a consequence, the field superposition property of yokeless structure does not apply to yoked magnet and the field strength attainable within the cavity has an upper limit dictated by the magnet geometry. Conversely, because the magnetic material performs only the function of generating the field within the cavity, in general yoked structures use less magnetic material than yokeless structures designed for the same field strength and the same geometry of the cavity. Thus weight of the magnetic material may become an important factor in the choice between a yokeless and a yoked magnet design, particularly if the design parameters dictate the use of high energy, high cost magnetic materials.

The following publications, which are all publicly available at the Library of New York University School of Medicine, are hereby incorporated by reference and form a part of this application:

1. M. G. Abele. Linear Theory of Yokeless Permanent Magnets. EMMA '89, Rimini, Italy, 1989.
2. M. G. Abele. Design of Yokeless Rare Earth Magnets for NMR Medical Applications. Proceedings of 10th International Workshop on Rare Earth Magnets, Kyoto, 1989, pp. 121-130.
3. M. G. Abele. Some Considerations about Permanent Magnet Design for NMR. TR-13, New York University, N.Y., N.Y. Feb. 1, 1986.
4. M. G. Abele. Design of Two-Dimensional Magnets without Magnetic Yoke. TR-15, New York University, N.Y., N.Y. Mar. 1, 1987.
5. M. C. Abele. Yokeless Permanent Magnets. TR-14, New York University, N.Y., N.Y. Nov. 1, 1986.
6. M. G. Abele. Three-Dimensional Design of a Permanent Magnet. TR-16, New York University, N.Y., N.Y. Jun. 1, 1987.
7. M. G. Abele. Use of Materials of Different Magnetic Permeabilities in Permanent Magnets. TR-17, New York University, N.Y., N.Y. Aug. 1, 1987.
8. M. G. Abele. Properties of the Magnetic Field in Yokeless Permanent Magnets. TR-18, New York University, N.Y., N.Y. Mar. 1, 1988.
9. M. G. Abele. Generation of a Uniform Field in a Yokeless Permanent Magnet for NMR Clinical Applications. TR-19, New York University, N.Y., N.Y. Jul. 1, 1988.
10. M. G. Abele. Generation of a Uniform Field in a Yokeless Permanent Magnet for NMR Clinical Applications. TR-19, New York University, N.Y., N.Y. Jul. 1, 1988.
11. M. G. Abele. Geometric Invariance of Yokeless Two Dimensional Magnets. TR-20, New York University, N.Y., N.Y. Mar. 1, 1989.

References in the text of this specification to previous publications followed by a numeral from 1 to 5 are intended to mean references 1 to 5 listed above. Previous publications (1, 2) have presented the design methodology for two-dimensional as well as three-dimensional yoked and yokeless magnetic structures capable of generating a uniform field within a cavity of arbitrary geometry. This application focuses on the problem of design optimization by discussing the properties of a figure of merit which characterizes the geometries of both categories. The analysis is confined to two-dimensional geometries and introduces the concept of hybrid magnet configurations whose design is optimized by taking advantage of the properties of both yoked and yokeless structures.

SUMMARY AND OBJECTS OF THE INVENTION

The present invention is achieved by an arrangement wherein a permanent magnetic structure comprising a first plurality of prismatic magnetized components arranged to form a cavity, these magnetic components oriented to concentrate a circulating magnetic flux in a closed loop along a given orientation along a path through said cavity, each of said magnetic components contributing to said flux, a second plurality of prismatic magnetized magnetic components, said second plurality positioned with respect to said first plurality and channeling said flux to close said path, and a third plurality of non magnetized magnetic components bordering said first plurality of components for providing an inductive path to channel said flux and to close said loops.

In accordance with the invention, the arrangement further provides for a permanent magnet structure having at least one loop of circulating flux, comprising a first and second plurality of uniformly magnetized prismatic magnetic material sections forming a polygonal shaped cavity and having a point F positioned along a zero equipotential base line joining two vertices within said cavity, said point being the reference for a figure of merit M corresponding to a maximum field strength and a minimum ratio of the value of the area of magnetized material to the area of said cavity, said first plurality of sections totally defining said cavity and having their respective remanences aligned to result in a total flux path passing orthogonally through said base line, said second plurality of sections oriented with respect to their respective remanences and to said first sections so as to confine the flux within the cavity, and a third plurality of non magnetized magnetic sections enclosing said base line and bordering said first sections for providing an inductive path to channel said flux and close said loop.

It is therefore the principal object of the present invention to combine the characteristics of a yoked magnet with a yokeless magnet to achieve a hybrid magnet design with a value of the figure of merit higher than the value of both yoked and yokeless designs.

It is another object of the invention to provide a novel and unique configuration of a permanent magnet which improves the efficiency of operation by minimizing the material used without sacrificing field strength.

DESCRIPTION OF THE DRAWINGS

FIG. 5 is a tabular presentation of the values of M and K of multiple layer structures with regular polygonal contours, where m denotes the number of layers and n the number of sides;

FIG. 8 shows computation of the figure of merit used to determine the quadrilateral cavity magnet of FIG. 7;

FIG. 10 shows computation of the figure of merit used to determine the optimum geometry of the magnet of FIG. 9;

FIG. 12 is a double layer magnet around a square cross-section cavity for K=0.8;

FIG. 22 is a tabular representation of the plotted values of FIG. 21;

FIG. 30 is a tabular representation of the plotted values of FIG. 29;

FIG. 32 is a tabular representation of the plotted values of FIG. 31;

FIG. 35 is a perspective view of FIG. 34.

DETAILED DESCRIPTION OF THE PREFERRED EMBODIMENTS

Figure 1:
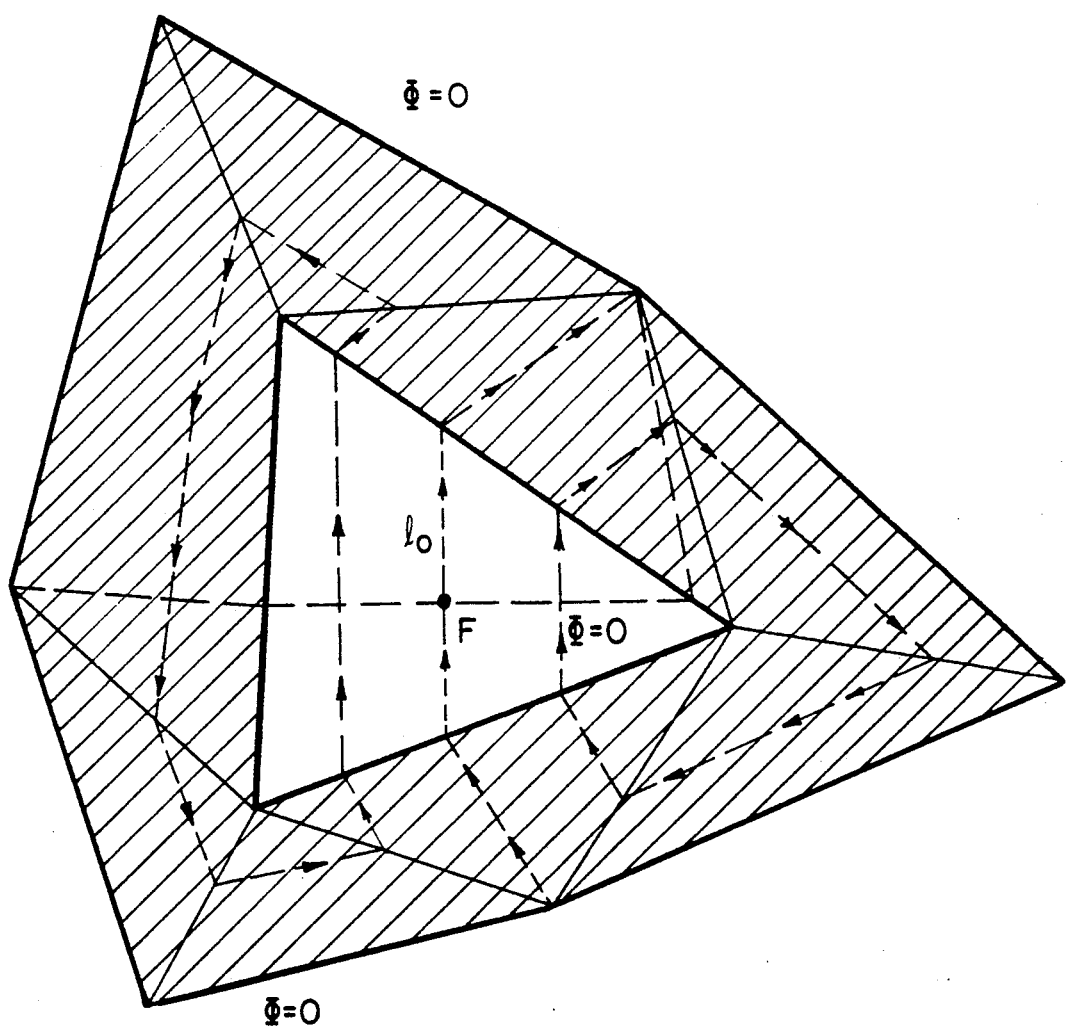
FIG. 1 is a schematic of a two-dimensional yokeless magnet.

Consider a two dimensional yokeless magnet with a prismatic cavity whose cross-section has the arbitrary polygonal contour shown in FIG. 1. It is the designer's task to determine the magnetic structure outside of the polygon of FIG. 1 which can generate a uniform field within the cavity with an arbitrarily assigned orientation in the plane of FIG. 1. The structure is assumed to be composed of uniformly magnetized prism of magnetic material, all magnetized with the same remanence $J_0$.

The remanence $J_0$ is a variable of the design problem, whose optimum value depends upon the geometry of the cavity and the additional constraints imposed by the designer. The design procedure starts by assuming an arbitrary value of the parameter $$K = \frac{H_0}{J_0} \qquad \text{EQ. (1)}$$

where $H_0$ is the magnitude of intensity $\vec{H}_0$ within the cavity.

FIG. 1 shows a point F within the cavity, which is common to the equipotential line $\Phi=0$ and to the line $l_0$ of force of vector $\vec{H}_0$ which divides the flux of the magnetic induction $\vec{B}$ within the magnetic structure in two parts as indicated in the figure. Ref. 1 has shown that the geometry of a yokeless magnetic structure is a function of the position of F and is independent of the orientation of $\vec{H}_0$.

Figure 2:
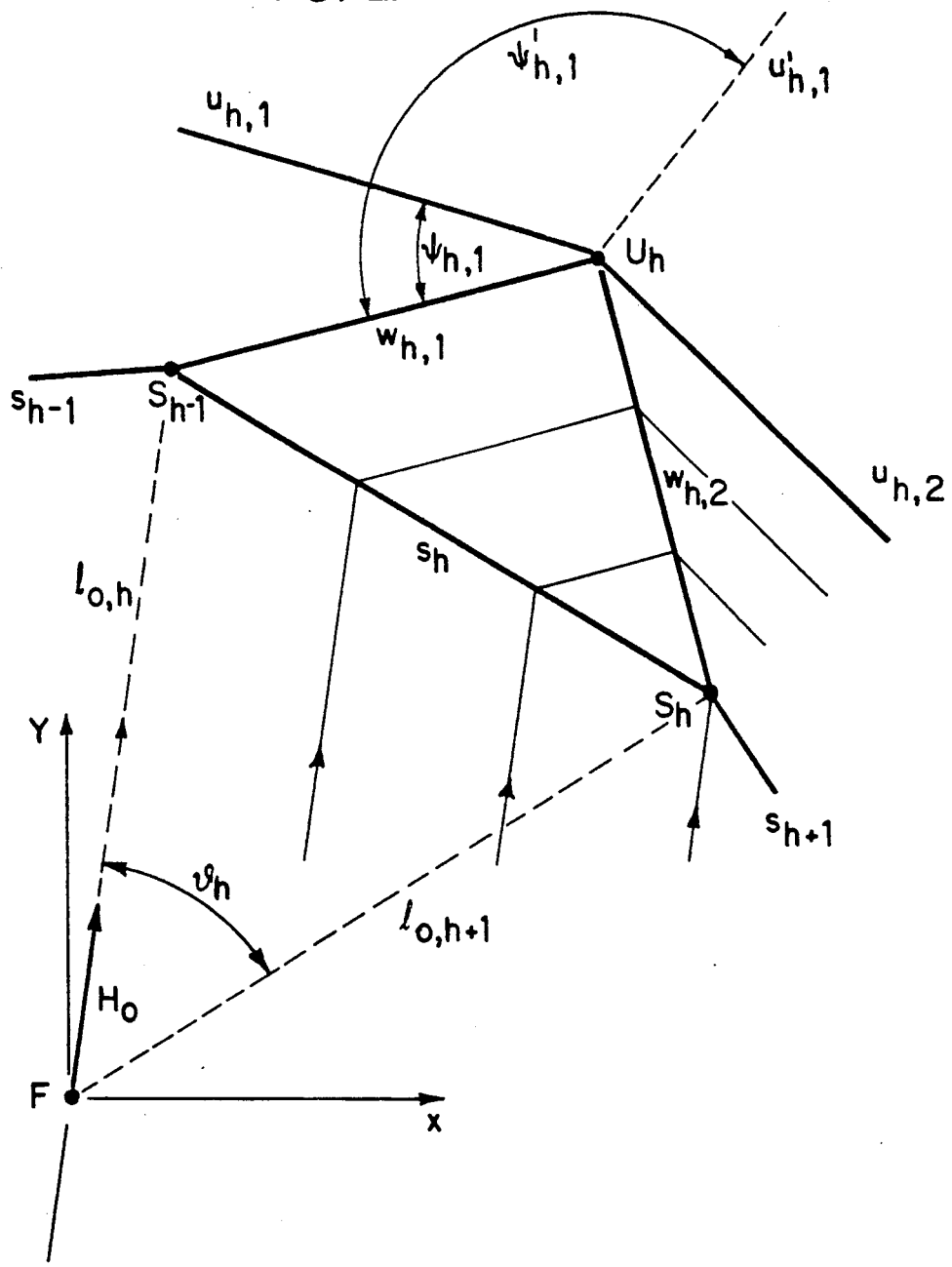
FIG. 2 shows computation of geometry and magnetization of magnet components.
Figure 3:
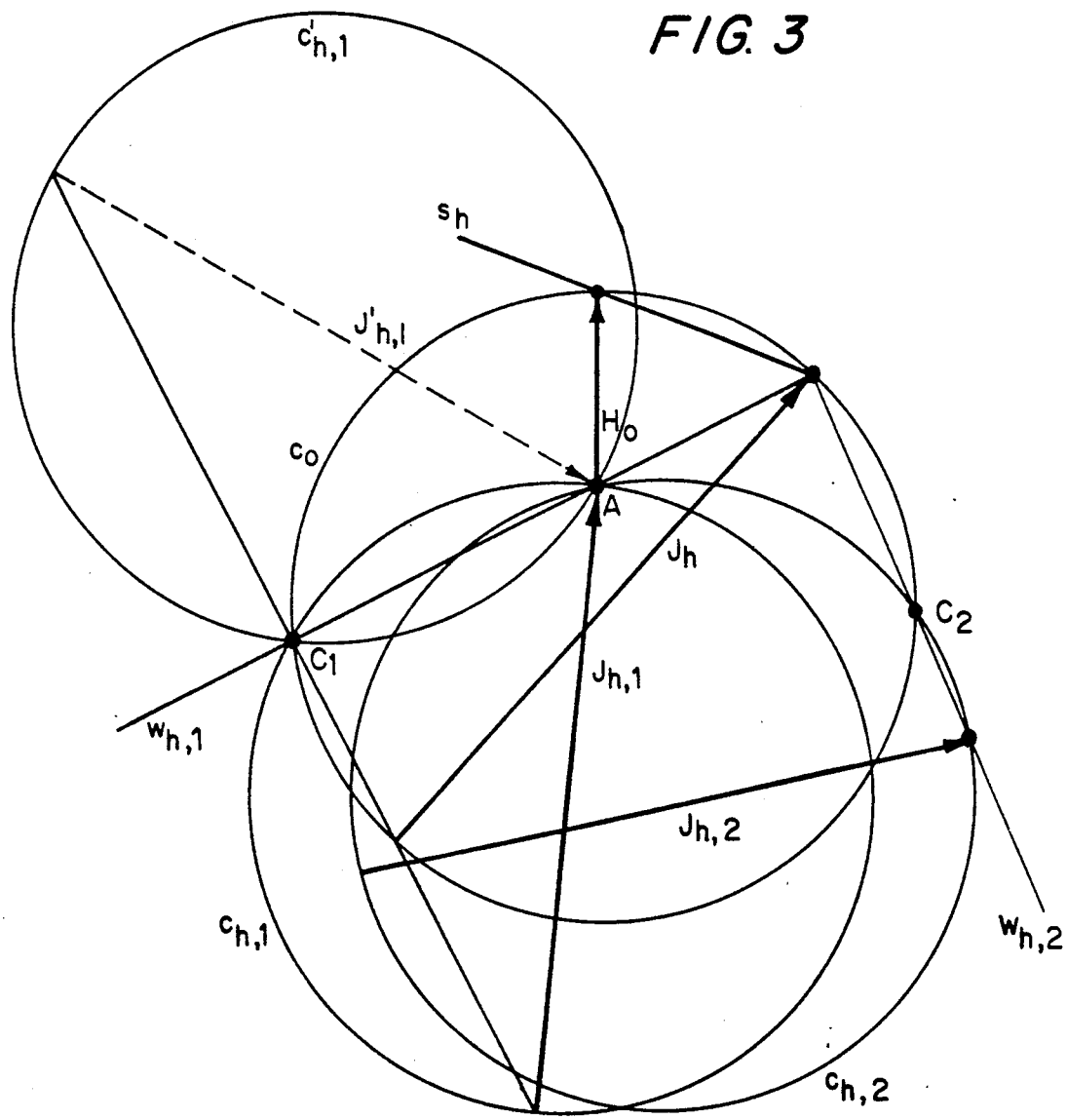
FIG. 3 is a vector diagram for a magnet design.

The design of a single layer, yokeless, two-dimensional magnetic structure has been introduced in "Some Considerations about Permanent Magnet Design for NMR", M. G. Abele, TR-13, New York University, N.Y., N.Y., Feb. 1, 1986, and "Design of Two-Dimensional Permanent Magnets without Magnet Yoke", M. G. Abele, TR-15, New York University, N.Y., N.Y., Mar. 1, 1987. The design procedure is defined by the schematic of FIG. 2 and by the vector diagram of FIG. 3. In FIG. 2 let $s_h$ be a side of the polygonal contour of the cavity. The design process starts by selecting an arbitrary value of parameter K (K<1) and a position of point F within the polygonal contour of the cavity, as indicated in FIG. 2. By virtue of the geometric invariance theorem (1), one can assume in FIG. 2 that $\bar{H}_0$ is oriented in the direction of the line $l_{oh}$ which contains point F and the end point $S_{h-1}$ of $s_h$. Line $s_h$ is the interface between the cavity and a uniformly magnetized prism whose remanence $\bar{J}_h$ has a magnitude $J_o$ given by Eq. 1. $\bar{H}_o$ and $\bar{J}_h$ are inscribed in circle $c_o$ of FIG. 3, and they are oriented at equal and opposite angles with respect to the unit vector $\hat{n}_h$ perpendicular to $s_h$. Circle $c_o$ provides the intensity $\bar{H}_h$ and the induction $\bar{B}_h$ in the prism with remanence $\bar{J}_h$. By definition, the interface $w_{h,1}$ must be a line of force of $\bar{B}_h$. The scalar potential on this interface is zero at a point $U_h$ whose distance $w_{h-1}$ from $S_{h-1}$ is given by $$\hat{H}_h \cdot \hat{w}_{k,1} = H_o l_{o,h} \qquad \text{EQ. (2)}$$

where vector $\hat{w}_{h,1}$ has the magnitude $w_{h,1}$ and is oriented from $U_h$ to $S_{h-1}$. Line $w_{h,1}$ is the interface between the prism with remanence $\bar{J}_h$ and a prism whose remanence $\bar{J}_{h,1}$ and intensity $\bar{H}_{h,1}$ satisfy the condition $$\hat{J}_{h,1} = -\hat{H}_{h,1} \qquad \text{EQ. (3)}$$

i.e. the magnetic induction $\bar{B}_{h,1}$ is zero in the prism with remanence $\bar{J}_{h,1}$. The value of $\bar{J}_{h,1}$ is provided in FIG. 3 by a circle of diameter $J_o$ which passes through points A and $C_1$. Two solutions are possible with circles $c_{h,1}$, $c'_{h,1}$ as shown in FIG. 3, which would yield interfaces $u_{h,1}$, $u'_{h,1}$ with the surrounding medium. The uncertainty is eliminated by selecting the solution with the smallest angle $\Psi_{h,1}$ relative to $w_{h,1}$. Thus $u_{h,1}$ is the selected part of the external boundary of the magnetic structure. By following an identical procedure, one determines the orientation of the second side $u_{h,2}$ of the external boundary which emerges from point $U_h$. The values of remanence $\bar{J}_{h,2}$ and vectors $\bar{B}_{h,2}$, $\bar{H}_{h,2}$ in the medium confined by interfaces $w_{h,2}$, $u_{h,2}$ are provided by the vector diagram inscribed in circle $c_{h,2}$ which passes through points A,$C_2$ of FIG. 3.

Figure 4:
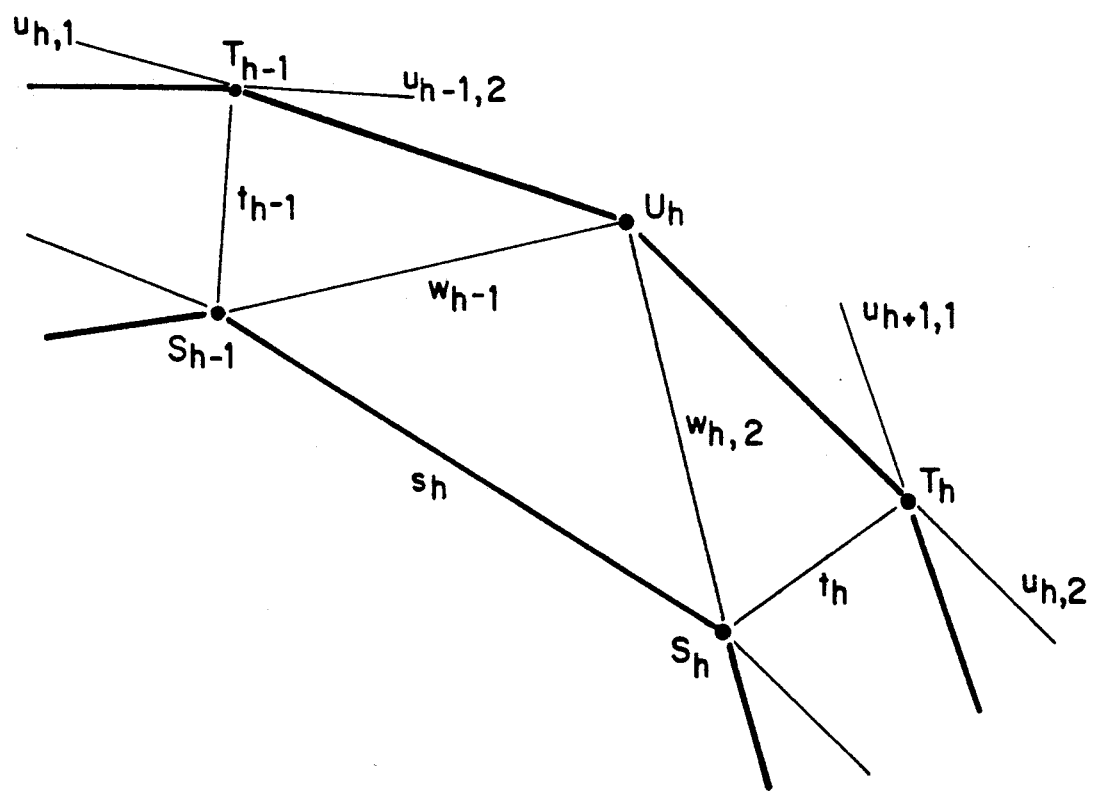
FIG. 4 shows computation of magnet external boundary.

The calculation is repeated for the side $s_{h+1}$ of the magnet cavity by selecting a new orientation of vector $\bar{H}_o$ along the line $l_{o,h+1}$ which joins point F and vertex $S_h$, as shown in FIG. 2. Upon completion of the calculation over all the n sides of the cavity, the external boundary of the magnetic structure is determined by the points of intersection $T_h$ between sides $u_{h,2}$ and $u_{h+1,1}$. Thus, as indicated in FIG. 4, points $T_h$, $U_h$ (h=1,2, ... n) are the vertices of the external polygonal contour of the magnet. Line $t_h$ is the interface between the prisms with remanence $\bar{J}_{h,2}$ and $\bar{J}_{h+1,1}$, and line $t_{h-1}$ is the interface between the prisms with remanences $\bar{J}_{h-1,2}$ and $\bar{J}_{h,1}$.

The orientation of the remanence $\bar{J}$ in each component of the magnetic structure must be corrected to be consistent with a common orientation of $\bar{H}_o$. In a two-dimensional yokeless magnet the orientation of vectors $\bar{J}$ relative to $\bar{H}_o$ satisfy the property that if $\bar{H}_o$ is rotated by an angle $\alpha$, all vectors $\bar{J}$ rotate by the same angle in the opposite direction. Assume for instance that the selected orientation of $\bar{H}_o$ forms an angle $\theta_o$ with the line $l_{o,n}$ which joins point F and vertex $S_n$. The correct orientation of the remanence of the components across interfaces $S_k$ (k=2, 3, ... n) is obtained by rotating vectors $\bar{J}_k$, $\bar{J}_{k,1}$, $\bar{J}_{k,2}$ by the angles $$\alpha_k = -\left(\theta_o + \sum_{h=2}^{k} \theta_h\right) \qquad \text{EQ. (4)}$$

where $\theta_h$ is the angle between lines $l_{o,h+1}$ and $l_{o,h}$ as shown in FIG. 2. Thus the geometry and distribution of magnetization of the single layer magnet designed around the assigned cavity for a given value of K and a given position of F are fully determined.

The magnetic structure is transparent to the field generated by other sources (3, 4) and, as a consequence, it is possible to increase the intensity of the field inside the cavity by means of a multi-layer structure composed of a number m of coaxial, single layer magnets designed with the method defined by the vector diagram of FIG. 3. The parameter K of the multi-layer structure is $$K = \sum_{i=1}^{m} K_i \qquad \text{EQ. (5)}$$

and m is a new design parameter. Each single layer is characterized by the condition $K_i \leq 1$. Thus, in principle, the multi-layer structure makes it possible to achieve a value of the intensity $\bar{H}_o$ larger than the remanence.

A basic criterium, followed by the designer of a conventional permanent magnet to optimize his design, is the selection of the operating point on the demagnetization curve that maximizes the energy product of the magnetic material. This approach results in a minimum weight of the magnetic material required to generate the field in the gap of the pole pieces of the magnet. The same criterium, however, cannot be applied to two or three dimensional structures where the intensity of the field varies in magnitude and orientation through out the magnetic material, and the design must proceed on the basis of the optimum combination of the parameters defined above.

The quality of the design can be expressed in a quantitative way by a figure of merit M defined as the fraction of the energy stored in the magnetic material which is used to generate the field inside the cavity. For a two-dimensional magnet $$M = K^2 \frac{A_c}{A_m} \qquad \text{EQ. (6)}$$

where $A_c$, $A_m$ are the cross-sectional areas of the cavity and of the magnetic material respectively.

The contribution of each element of magnetized material to the field at a point of the cavity decreases rapidly with the distance of the point from the element. This consideration indicates that the most efficient magnets should be axis symmetric structures enclosing cavities with regular polygonal contours.

Consider a cavity whose cross section is a regular polygon of n sides and assume that point F is selected at the center of the polygon. In general, sides $u_{h,1}$, $u_{h,2}$ do not belong to the same line. Thus a single layer magnet designed around the polygonal cavity for an arbitrary value of parameter K has an external polygonal contour of 2n sides. The external contour becomes a regular polygon of n sides if (2)

$$K = 1 - \cos(\pi/n) \qquad \text{EQ.(7)}$$

and if the internal polygon is inscribed in a circle of radius $r_i$, the external polygon is inscribed in a concentric circle of radius $r_e$:

$$\frac{r_e}{r_i} = \frac{1}{\cos(\pi/n)}. \qquad \text{EQ. (8)}$$

Thus the area ration $A_m/A_c$, and the figure of merit M are $$\frac{A_m}{A_c} = \frac{1}{\cos^2(\pi/n)} - 1,\qquad \text{EQ. (9)}$$

$$M = \cos^2(\pi/n) \frac{1 - \cos(\pi/n)}{1 + \cos(\pi/n)}.$$

Assume now a system of coaxial single layer magnets of regular polygonal boundaries of n side, each designed for the value of K given by Eq. 7. If no air space is left between the individual magnets, the outer magnet is inscribed in a circle of radius $r_e$ given by $$\frac{r_e}{r_i} = \frac{1}{\cos^m(\pi/n)} \qquad \text{EQ. (10)}$$

and the figure of merit of the multi-layer structure is $$M = \frac{K^2}{\cos^{-2m}(\pi/n) - 1} \qquad \text{EQ. (11)}$$

where parameter K is $$K = m[1 - \cos(\pi/n)]. \qquad \text{EQ. (12)}$$

In the limit $m \to \infty$, $n \to \infty$ for a constant value of $r_e/r_i$ the inner and outer boundaries of the cross-section of the magnetic structure are the circles of radii $r_i$, $r_e$ respectively, and Eqs. 11, 12 become $$K = \ln \frac{r_e}{r_i},\ M = \frac{K^2}{e^{2K} - 1} \qquad \text{EQ. (13)}$$

Thus in the limit $m \to \infty$, $n \to \infty$, the magnetic structure reduces to a continuous distribution of $\vec{J}$ where at each point $\vec{J}$ is oriented at an angle equal and opposite to the angle between $\vec{H}_o$ and the radial coordinate of that point (5).

The figure of merit given by Eq. 13 vanishes at $K = 0$ and $K = \infty$. M attains its maximum value for the value of K which satisfies the transcendental equation $$(1 - K)e^{2k} = 1 \qquad \text{EQ.(14)}$$

i.e.

$$K_{max} \sim 0.797, M_{max} \sim 0.162. \qquad \text{EQ.(15)}$$

$M_{max}$ is the upper bound of the figure of merit of either a single layer or multi-layer two-dimensional yokeless magnet, regardless of its geometry and distribution of magnetization.

Figure 6:
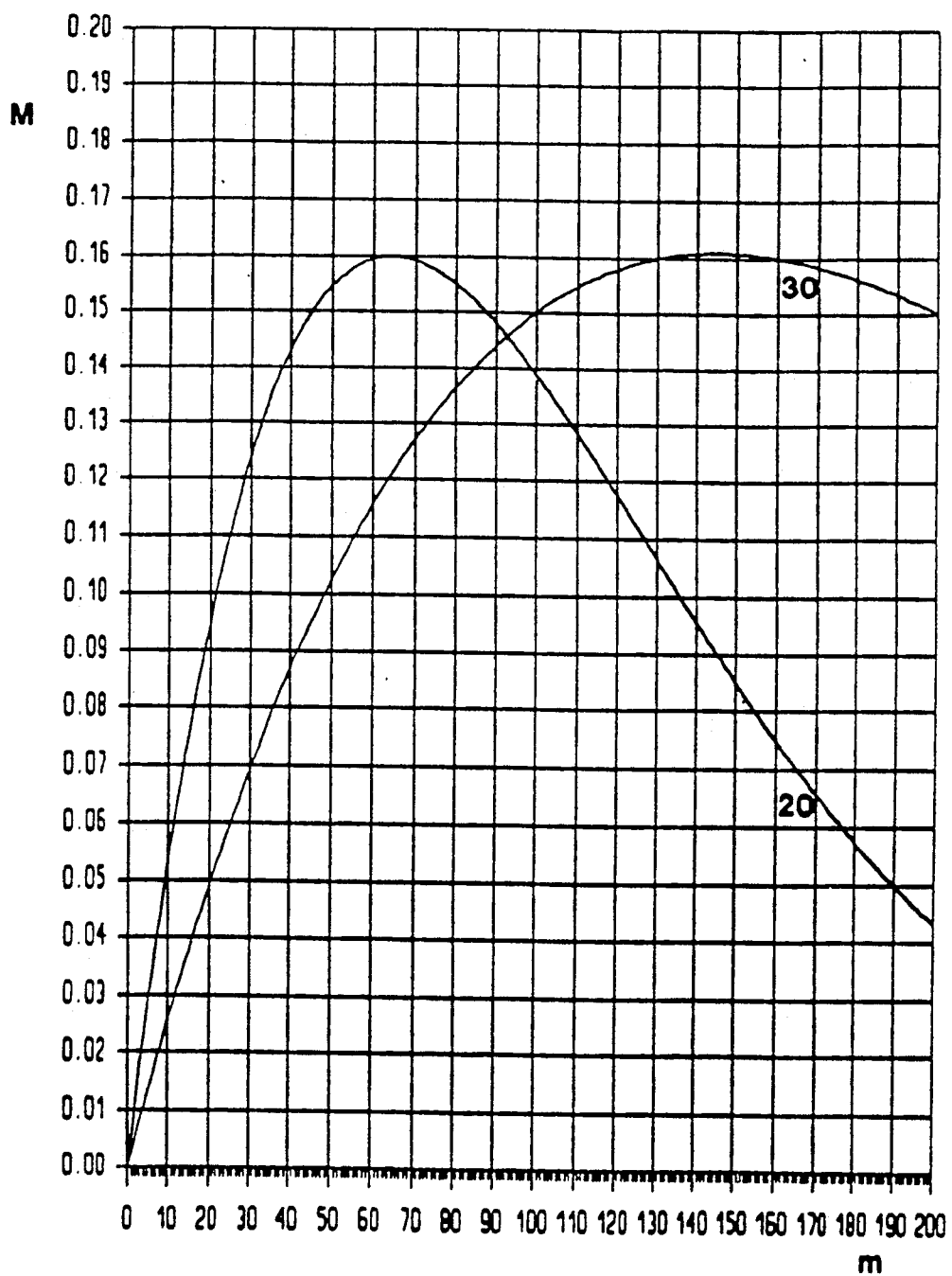
FIG. 6 is a graphical representation which plots M versus the number of layers for large values of the number of sides of the regular polygonal cavity.

Each geometry of the magnet cavity is characterized by its maximum value of $M < M_{max}$ which is achieved at an optimum value of K. In the particular case of regular polygonal contours, FIG. 5 is a table which lists the values of M and K given by Eqs. 11 + 12 for the lowest values of m, n. One observes that the optimum value of M of a triangular geometry is achieved with a single layer, and the optimum value of M of a square geometry is achieved with a two layer magnet. A plotting of M versus the number of layers for large values of n is shown in FIG. 6. Regardless of the values of m, n the optimum value of M is always found at $K < 1$.

Figure 7:
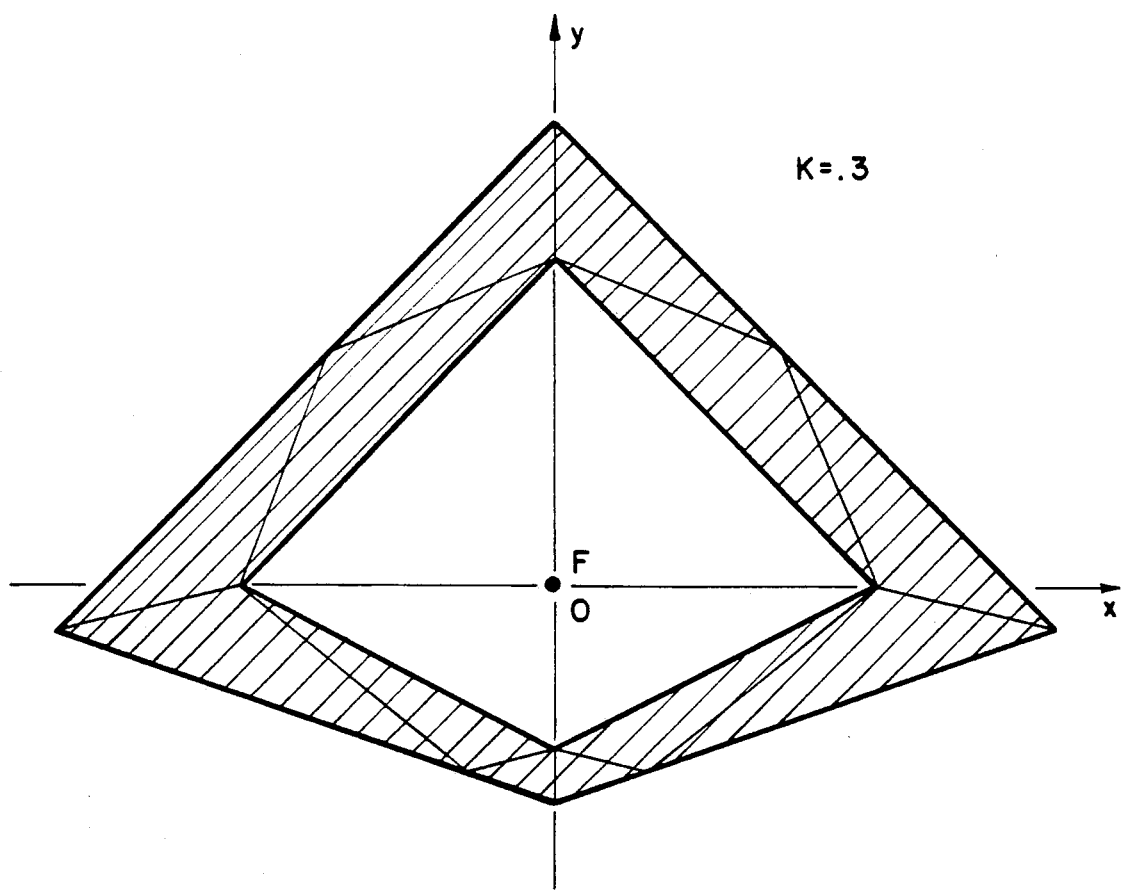
FIG. 7 shows a quadrilateral cavity magnet designed for K=0.3.

In general, the design starts with a given geometry of the magnet cavity which is not a simple regular polygon. As an example, consider the quadrilateral contour of the magnet of cavity shown in FIG. 7. The single layer magnet shown in FIG. 7 is the result of $K = 0.3$ and the selection of point F at the origin of the frame of reference of coordinate x,y which pass through the vertices of the quadrangle. The values of M and $A_m/A_c$ of the magnet of FIG. 7 are $$M \sim 0.077,\ A_m/A_c \sim 1.16. \qquad \text{EQ.(14)}$$

The determination of the optimum single layer magnet designed around the cavity of FIG. 7 results from the calculation of the figure of merit of magnet geometries for all values of K in the range $0 < K < 1$ and all values of the coordinates $x_F$, $y_F$ of point F within the cavity. The optimum values of the design parameters are $$x_F = 0, y_F \sim 0.149, K \sim 0.590, M \sim 0.110. \qquad \text{EQ.(17)}$$

Figure 9:
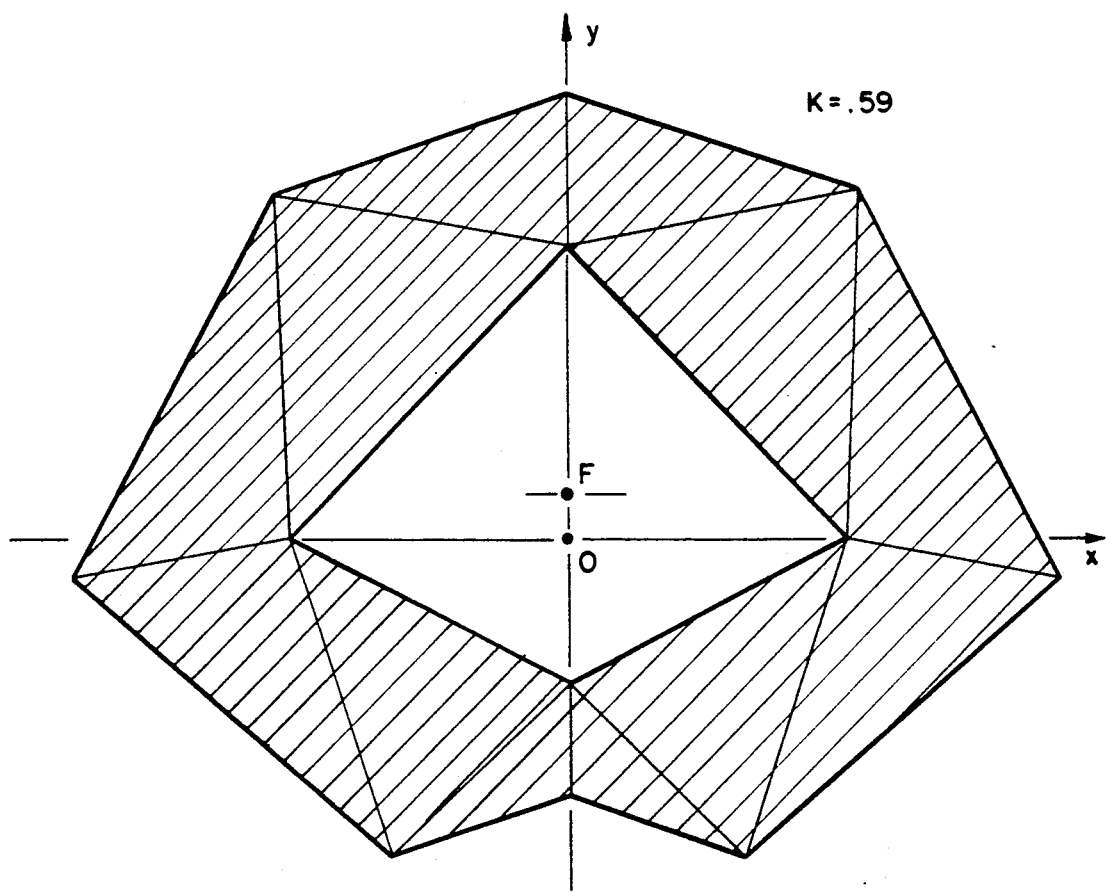
FIG. 9 shows the optimum single layer design around the cavity of FIG. 7.
Figure 11:
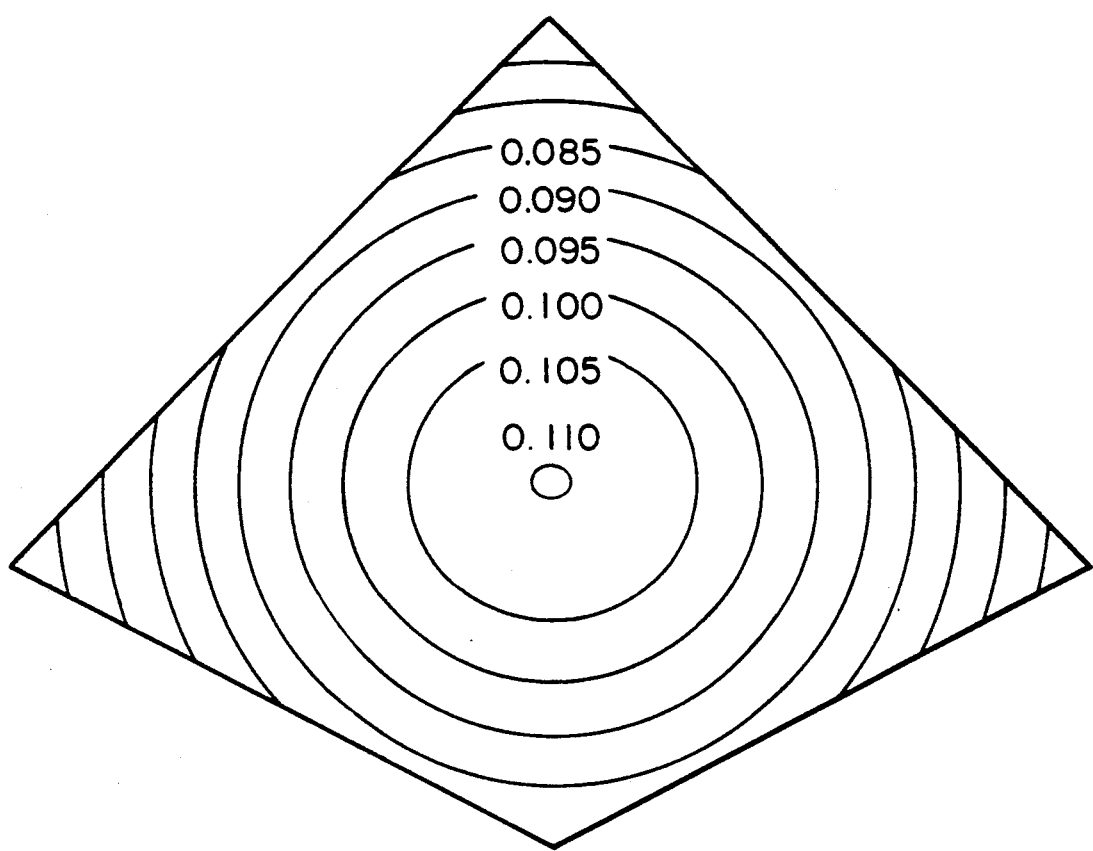
FIG. 11 is a plotting of M=const curves for the quadrilateral cavity of FIG. 7.

The optimum geometry corresponding to parameters of Eq. (17) is shown in FIG. 9. The effect of a change of the position of point F on the figure of merit is shown in FIG. 11 where the lines of constant value of M are plotted in the plane of the cavity for the value $K = 0.590$. M suffers a substantial decrease as F moves from its optimum position to points close to the boundary of the cavity.

For symmetric cavities the optimum position of F is the center of symmetry, and the optimization of the magnet design reduces to the calculation of the optimum value of K. As shown in the table of FIG. 5, in general, a multi layer design is required to optimize the value of M. As an example, FIG. 12 shows a two-layer design around a square cross-section cavity. If the magnet consisted of the first layer alone, the value of K and M would be $$K_1 \sim 0.560, M_1 \sim 0.118. \qquad \text{EQ.(18)}$$

The cross section of the external surface of the first layer is a regular octagon. The square and the octagon are inscribed in two circles of radii $r_i$, $r_e$, whose ratio is $$\frac{r_{e1}}{r_i} \approx 1.61. \qquad \text{EQ. (19)}$$

The value of K can be increased with an additional improvement of the figure of merit by a second layer, whose internal boundary coincides with the octagonal cross-section surface, as indicated in FIG. 12. The maximum value of the figure of merit is found at the value of K of the second layer $$K_2 \sim 0.24 \qquad \text{EQ.(20)}$$

which yield the values of K and M of the two layer magnet $$K = K_1 + K_2 \sim 0.8, M \sim 0.128 \qquad \text{EQ.(21)}$$

corresponding to an area ratio $A_m/A_c = 5.0$.

A yokeless magnet performs the two functions of generating the field within the cavity and closing the flux of the magnetic induction. Ideally, in a yoked magnet the external surface of the magnetic structure is the interface with a medium of infinite magnetic permeability which performs the function of closing the flux of the magnetic induction and forcing the external surface of the magnetic material to be equipotential, thereby making it possible to achieve a uniform field within the cavity.

Figure 13:
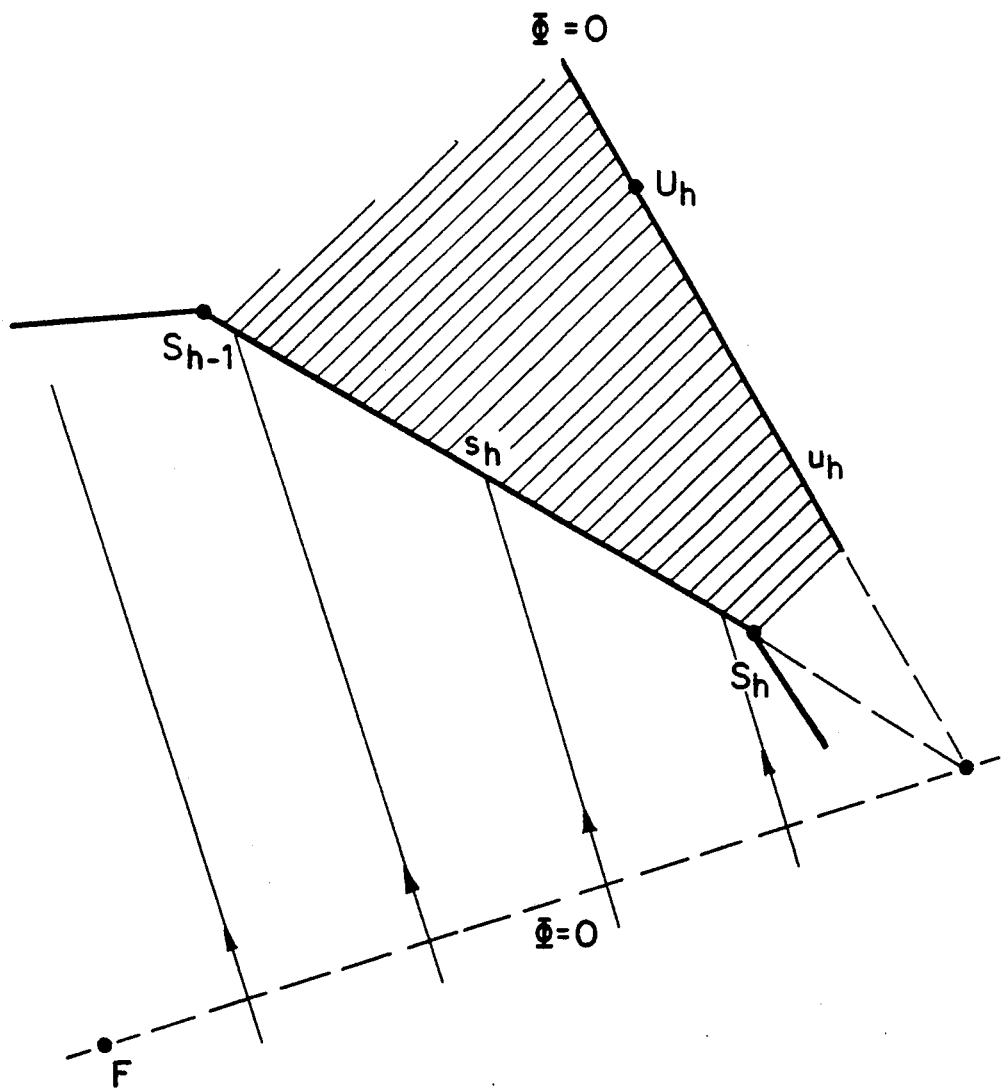
FIG. 13 is the basic schematic of a yoked magnet geometry.

FIG. 13 is the basic schematic of a yoked structure. $s_h$ is the interface between the magnet cavity and a prism of magnetized material where $\bar{J}_h$, $\bar{B}_h$, $\bar{H}_h$ are determined by the same vector diagram of circle $c_o$ of FIG. 3 on the basis of an assigned orientation of $\bar{H}_o$ which is now the same for all sides of the cavity. The external surface $u_h$ of the prism is perpendicular to $\bar{H}_o$ and it passes through point $U_h$ as indicated in FIG. 13, if F is located at the same position of FIG. 2. Thus the scalar potential vanishes on $u_h$. The sides of the external boundary of the yoked structure are determined by the intersections $V_h$ of lines $u_h$ computed in each region which interfaces with the magnet cavity (3), and the external boundary is assumed to be the surface of a medium of infinite magnetic permeability.

Figure 14:
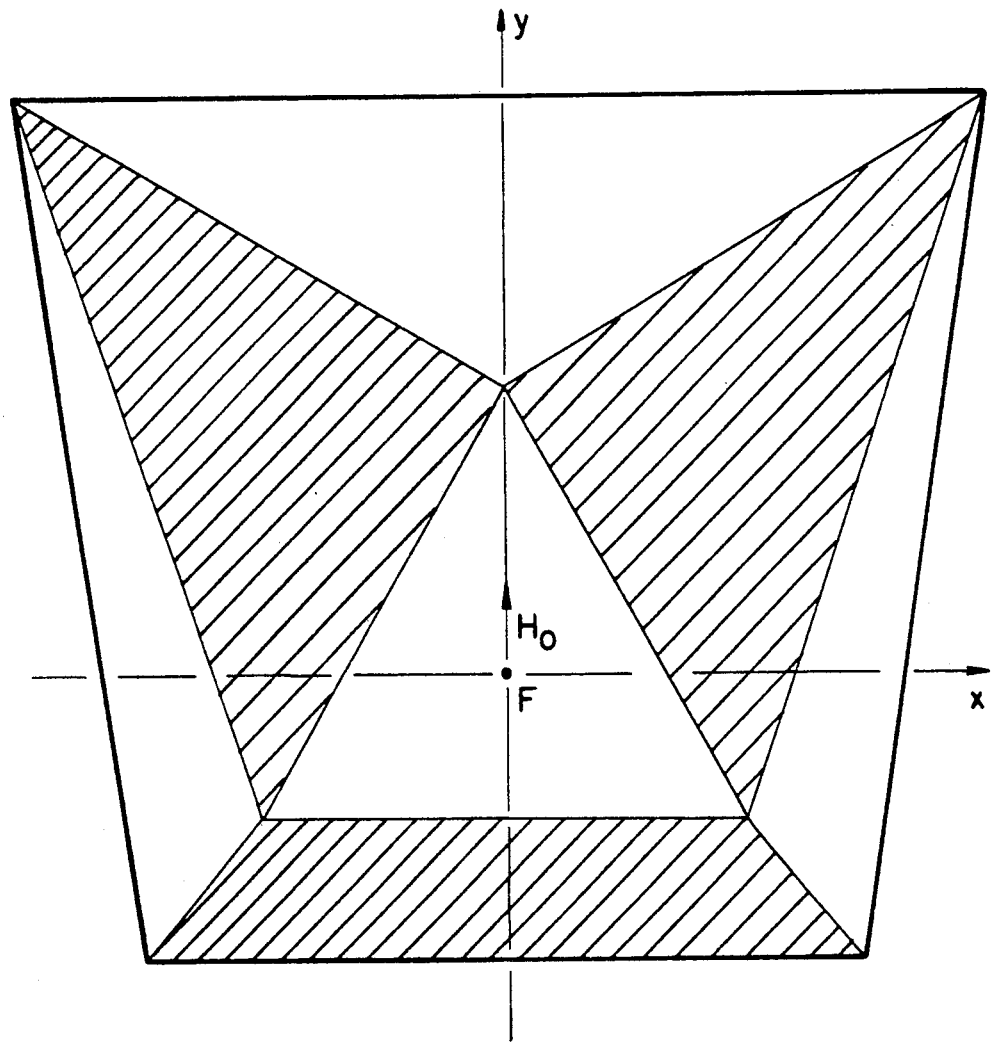
FIG. 14 is an example of yoked magnet with triangular cavity.
Figure 15A:
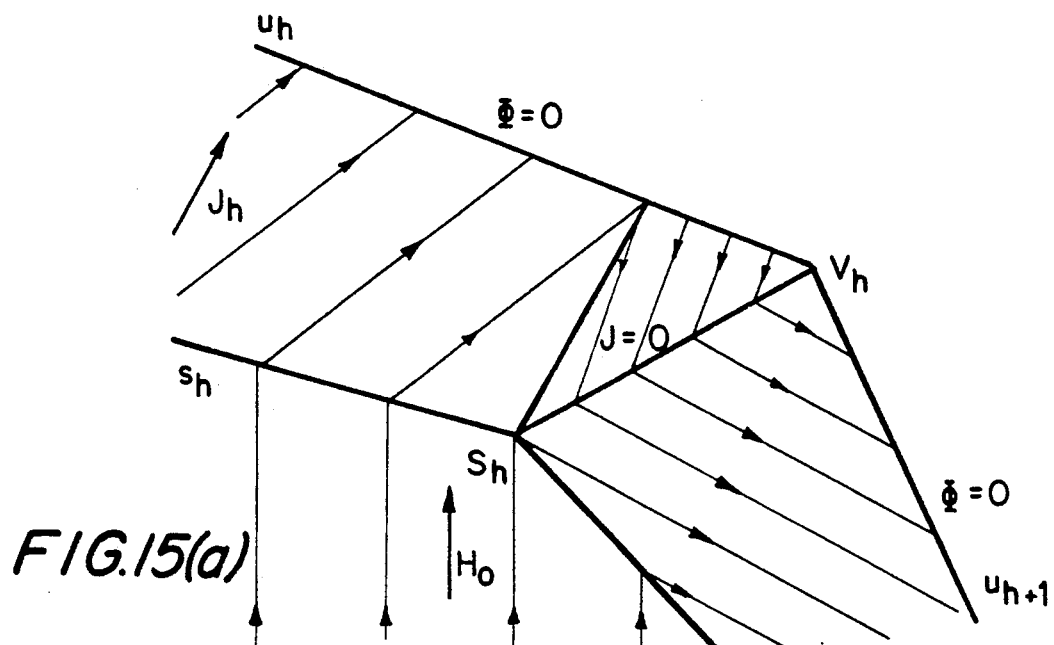
FIGS. 15(a) and 15(b) show transitions between components of a yoked magnet.

An example of yoked two-dimensional magnets is the structure of FIG. 14 with an equilateral triangular cross-section of the cavity. The magnet of FIG. 14 is designed for $K = 0.5$, with $\bar{H}_o$ parallel to the y-axis and point F located at the center of the triangle as shown in this figure. The transition between two regions of magnetized material cannot be accomplished by a single interface, and it requires the insertion of an air wedge between the two regions as shown in the example of FIG. 14. The geometry of the air wedge between the h and h+1 regions is defined in a general case by either FIG. 15a or FIG. 15b (4). The wedge of FIG. 15a is confined by line $S_h$, $V_h$, a line parallel to remanence $\bar{J}_h$ and a segment of the external side $u_h$. The wedge of FIG. 15b is confined by line $S_h$, $V_h$, a line parallel to remanence $\bar{J}_{h+1}$ and a segment of the external side $u_{h+1}$.

Figure 15B:
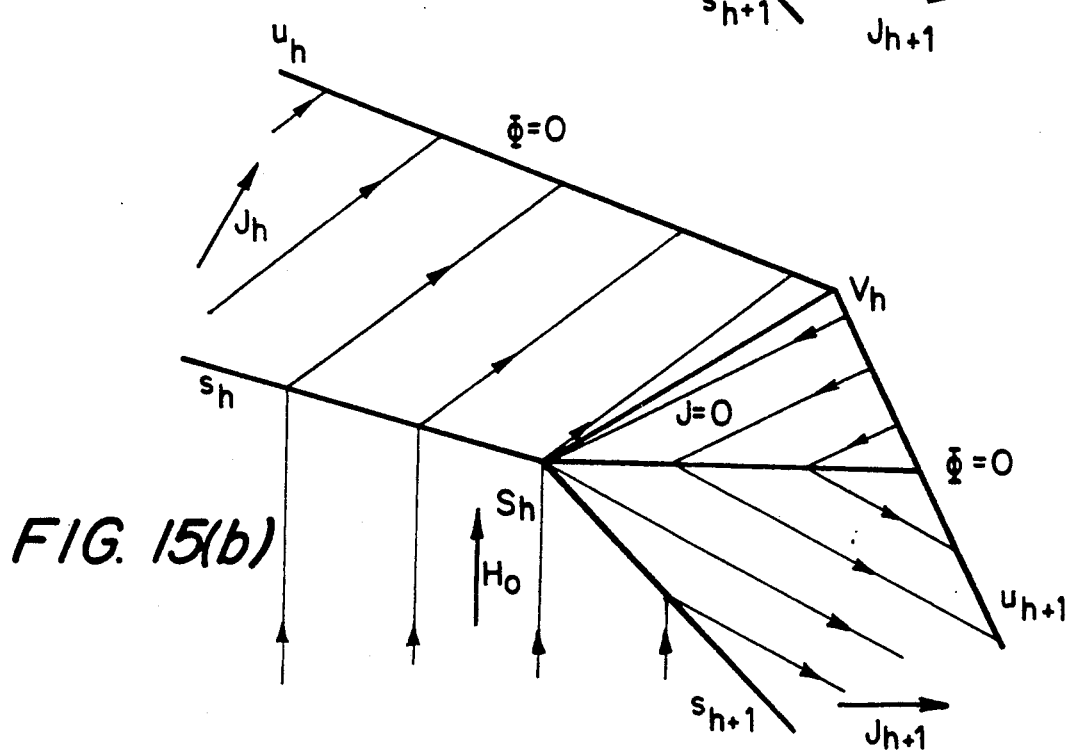

FIGS. 15a and 15b show the lines of force of the magnetic induction within the magnetic structure. The flux of $\bar{B}$ crosses the interface between the magnetic structure and the external yoke, and one notices the reversal of the direction of the flux in the air wedges between the magnetized components. Because the external boundary of the magnetic structure is perpendicular to the intensity of the magnetic field, the geometry of a yoked magnet depends on the orientation of $\bar{H}_o$, in addition to the value of K and the position of F.

Figure 16:
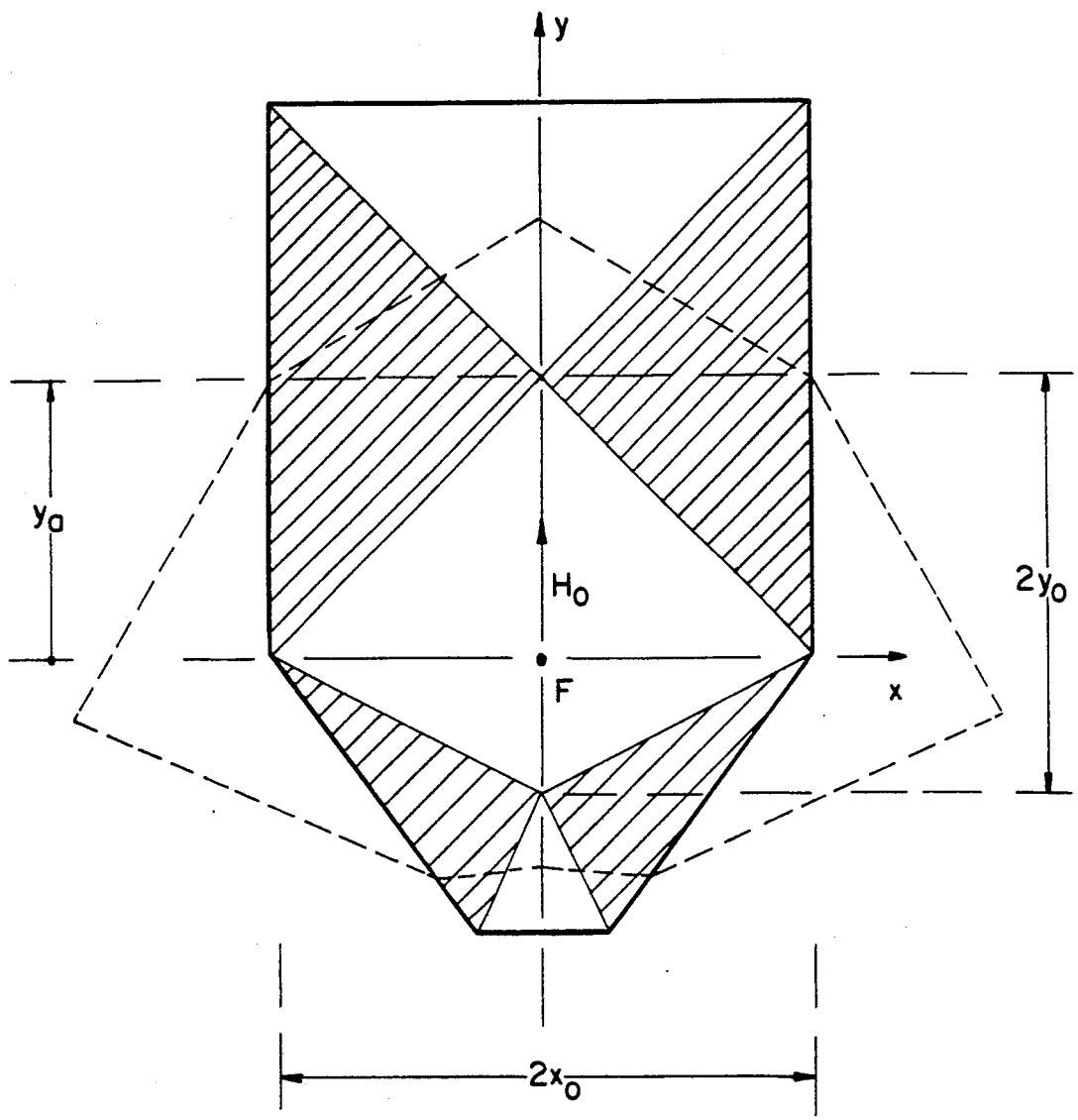
FIG. 16 is a comparison of geometries of a yoked and yokeless magnets with quadrangular cavity for K=0.5.

Of particular interest, in comparing yoked and yokeless structures built around the same cavity, are situations where the equipotential line $\Phi = 0$ within the magnet passes through two vertices of the polygonal cavity. Consider for instance the same quadrangular geometry analyzed in the previous section and compute the magnetic structure which corresponds to a point F located at the origin of the frame of reference and an intensity $\bar{H}_o$ oriented along the y axis. The magnet geometry for $K = 0.5$ is shown in FIG. 16, where the broken line is the external boundary of the yokeless magnet computed for the same value of K and the same position of F. In the yoked magnet of FIG. 16, the area of the air wedges between the magnetized components is about 70% of the area of the cavity cross-section. The total area of the air regions is equal to the area occupied by the magnetic material. Thus a large fraction of the energy is spent to generate the field in the air wedges.

Conversely, the region confined by the broken line of FIG. 16 and of the external boundary of the yoked structure, is the area of the prismatic components of the yokeless structure where the intensity is equal to zero when $\bar{H}_o$ is oriented along the y axis and F is located at the origin of the frame of reference. Thus this area of the magnetized material of the yokeless magnet is used only to close the flux of the magnetic induction, without contributing to the field within the cavity.

The figure of merit of a yoked magnet is always defined as the fraction of the energy stored in the magnetic material which generates the field within the region of interest: i.e. the cavity of the magnet.

In FIG. 16, $2x_o$, $2y_o$ are the length of the two diagonals of the cavity and $y_a$, $y_b$ are the ordinates of the two vertices on the y axis ($y_a + y_b = 2y_o$). With the assumption that F is located at the origin of the frame of reference and $\bar{H}_o$ is oriented in the direction of axis y, the figure of merit is $$M = 2K(1 - K) \frac{x_o^2 y_o}{y_a(x_o^2 + y_a^2) + y_b(x_o^2 + y_b^2)} \qquad \text{EQ. (22)}$$

i.e. M is a parabolic function of K with its maximum value at $$K = 0.5 \qquad \text{EQ.(23)}$$

and the optimum value of K is independent of the dimensions of the quadrangle. One observes that the figure of merit increases as $x_o$ increases and it attains its maximum value $M_{max}$ at $x_o \to \infty$, i.e. when the magnet becomes a one-dimensional structure confined between two infinite plane surfaces located at $y = y_a$, $y = -y_b$. At $K = 0.5$ one has $$M_{max} = 0.250. \qquad \text{EQ.(24)}$$

The value of Eq. 24 represents the upper bound of the figure of merit that can be achieved in a yoked magnet, regardless of its geometry and orientation of the field. Eq. 24 shows that the a yoked magnet can achieve a figure of merit substantially larger than that of a yokeless magnet whose upper bound is given by Eq. 16.

At constant value of $x_o$, $y_o$, the rate of change of M as a function of $y_a$ is $$\frac{dM}{dy_a} = 24K(1 - K)x_o^2 y_o^2 \frac{y_a - y_o}{[y_a(x_o^2 + y_o^2) + y_b(x_o^2 + y_b^2)]^2} . \qquad \text{EQ. (25)}$$

Thus the optimum of the figure of merit is achieved at $y_a = y_o$, i.e. when the cavity is symmetric with respect to point F. In this case the cavity is a rhombus and $$M = K(1 - K) \frac{x_o^2}{x_o^2 + y_o^2}.$$ EQ. (26)

With the assumption of a linear demagnetization curve, at the optimum value $K=0.5$, the magnitude of the intensity of the magnetic field is everywhere equal to $J_o/2$, and within the magnetized material the intensity is oriented in the direction opposite to $\vec{J}_o$. Thus, the magnetized material operates at the peak of the energy product curve, as it is the case of the optimum design of a conventional magnet.

It is of importance to point out that if one would define the figure of merit as the fraction of the energy used to generate the field in the cavity as well as the air wedges, the value $M_{max}$ give by Eq. 24 would be attained at $K=0.5$ regardless of the values of $x_o$, $y_o$, $y_a$. This situation is conceptually identical to that of the design of a conventional magnet where part of the energy is spent in the fringe field outside of the region of interest. Obviously, the orientation of $\vec{H}_o$ is a design parameters which affects the amount of energy spent outside of the region of interest. For instance, as shown by Eq. 26 to optimize M, $\vec{H}_o$ must be oriented along the shortest diagonal of the rhombus.

Figure 17:
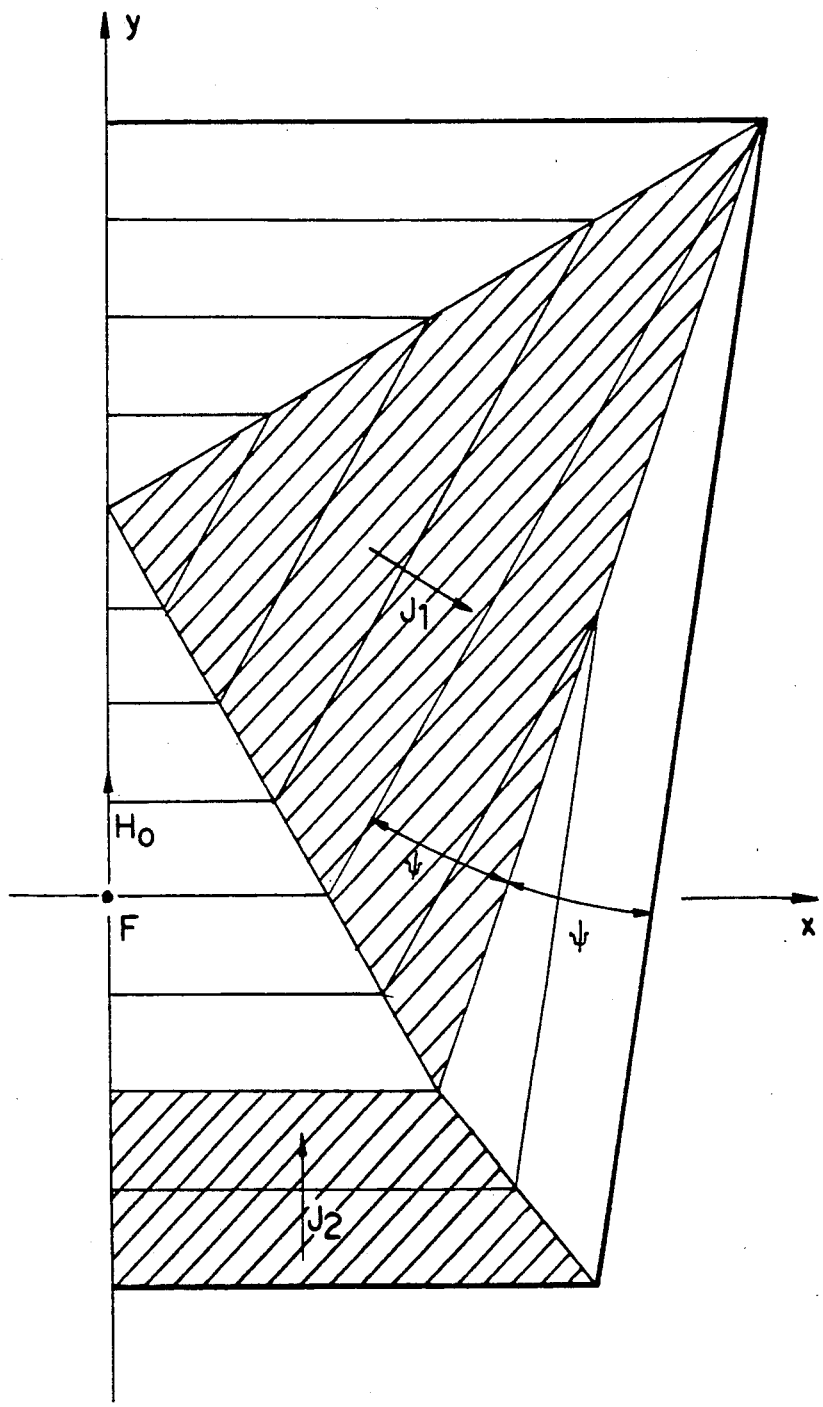
FIG. 17 is a yoked magnet with triangular cavity.

The dependence of M on the position of F can be illustrated in the example of the triangular cavity of FIG. 14, in the particular case of $\vec{H}_o$ oriented along the y-axis. FIG. 17 shows the magnet cross-section in the $x > 0$ region, with the details of geometry and magnetization of the magnetized material for $K=0.5$ and F located at the center of the triangle which is chosen as the origin of the frame of reference. Shown in FIG. 17 also are the equipotential lines. In remanence $\vec{J}_1$ is oriented at 120° relative to the axis y and remanence $\vec{J}_2$ is oriented along the y axis. The figure of merit of the magnet of FIG. 17 is $$M \sim 0.0711.$$ Eq.27

Figure 18B:
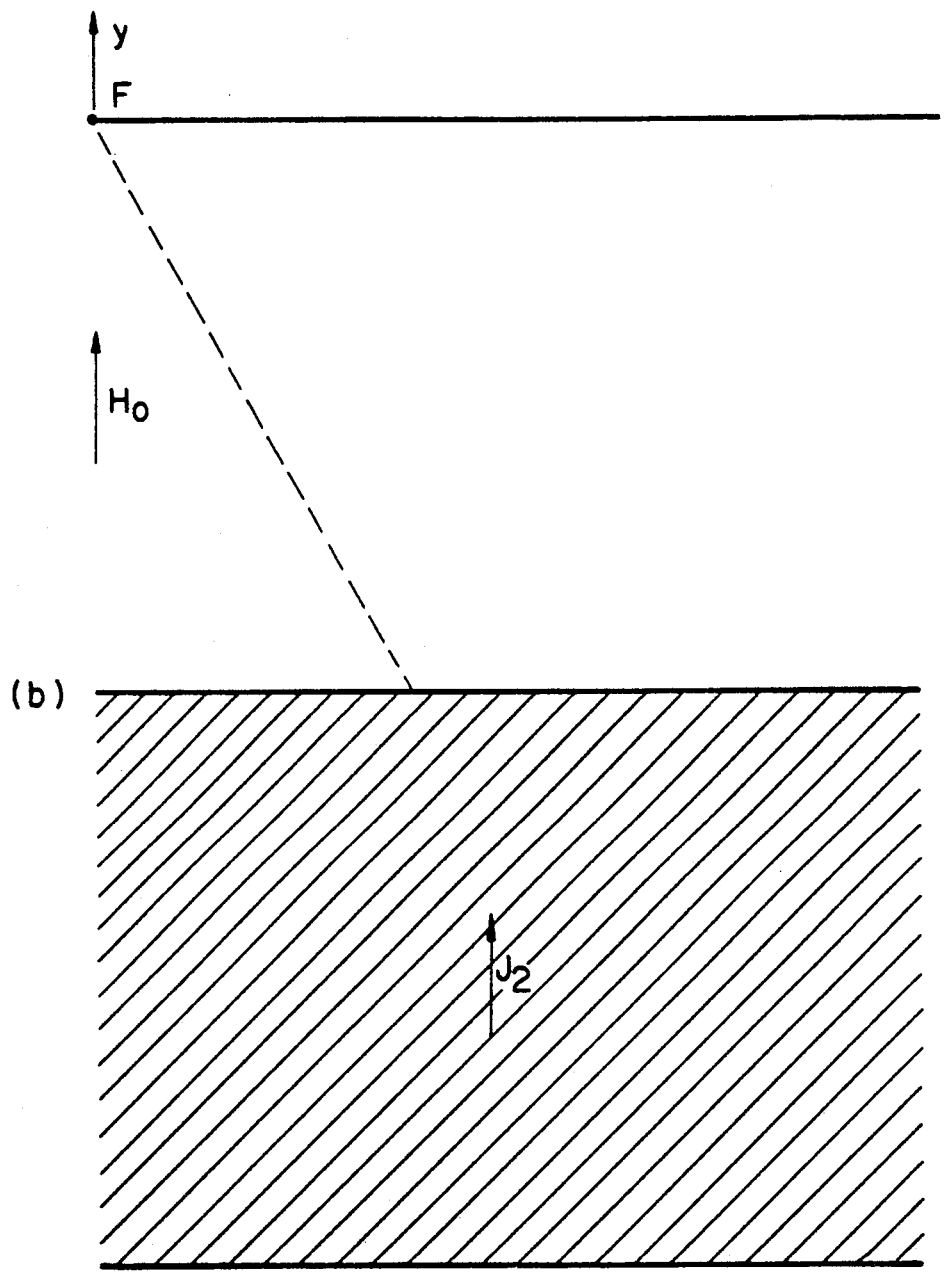
FIG. 18(a) represents the yoked magnet geometries for $x_F=0$, $y_F=-0.5$ (a) and $x_F=0$, $y_F=1.0$ (b).

The maximum value is $M \sim 0.072$ at $x_f = 0$, $y_F \sim 0.14$. Of particular interest are the two extreme cases where F is located on the base of the triangle ($x_f = 0$, $y_f = -0.5$) and at the vertex $P_1$ ($x_f = 0$, $y_f = +1.0$) which are shown in FIG. 18. In FIG. 18a the area ratio is $A_m/A_c = 4.00$ and the figure of merit is $M = 0.0625$. In FIG. 18a, the medium with remanence $\vec{J}_1$ vanishes. Thus the interface between the cavity and this medium vanishes and the magnet becomes a one dimensional structure where the interface between air and magnetized material is the plane $y=0$. Because in the limit of FIG. 18b the area of the magnetized material is infinitely large compared to the "area of interest", the figure of merit is $$M = 0.$$ Eq.28

Figure 19A:
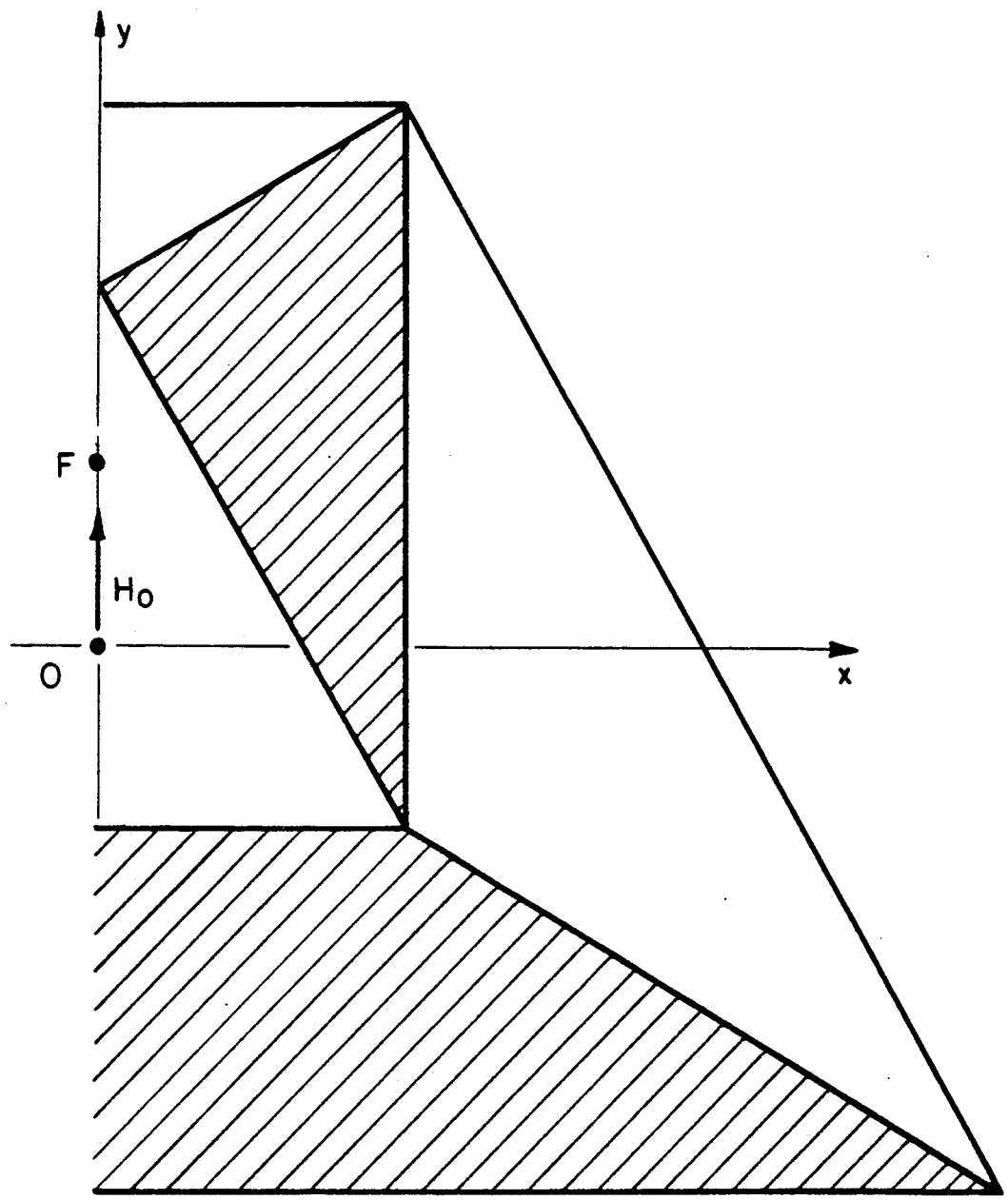
FIG. 19 represents yoked magnet geometries for intermediate positions of point F.
Figure 19B:
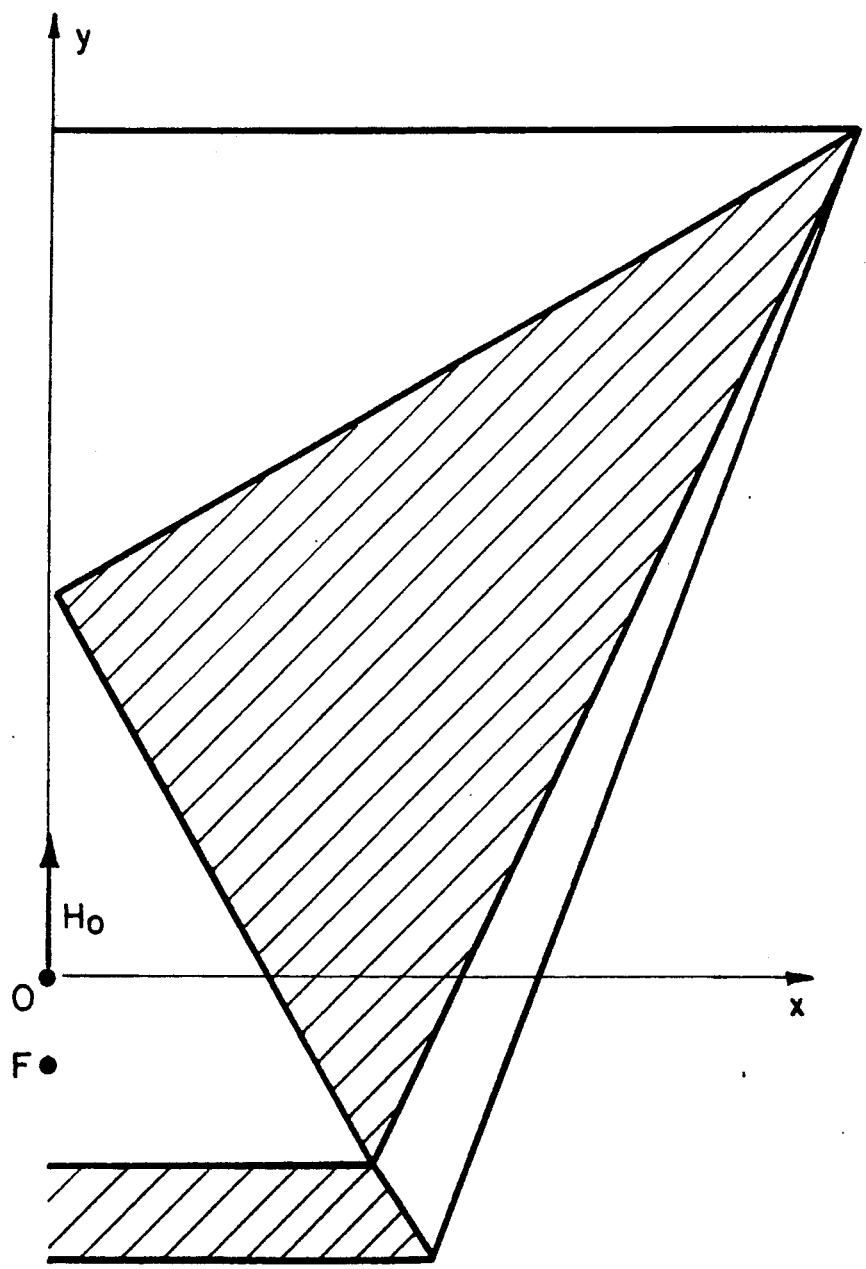
Figure 20A:
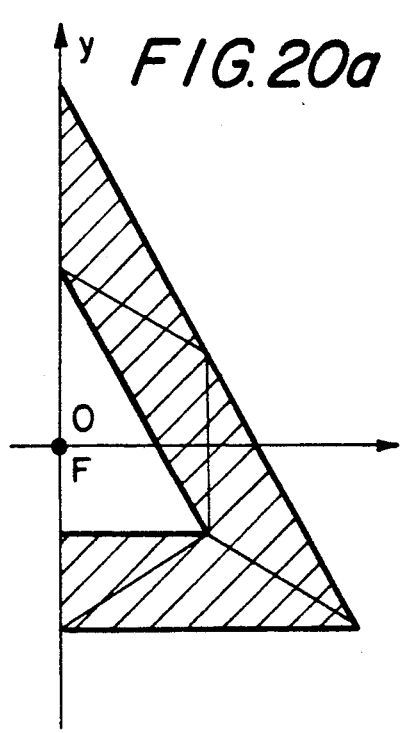
FIG. 20 represents geometries of yokeless magnets with triangular cavities.
Figure 20B:
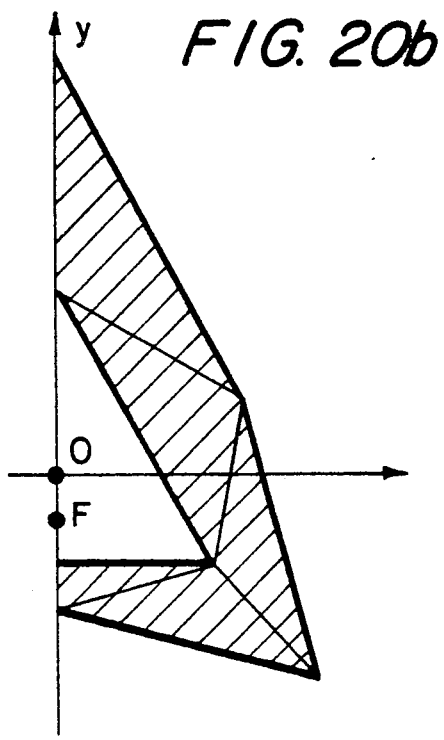
Figure 20C:
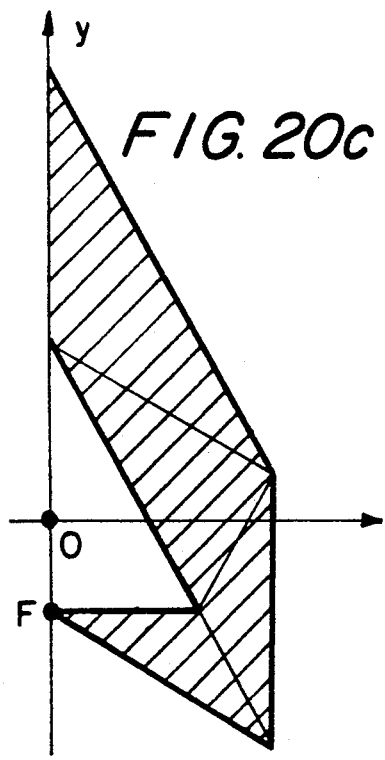
Figure 20D:
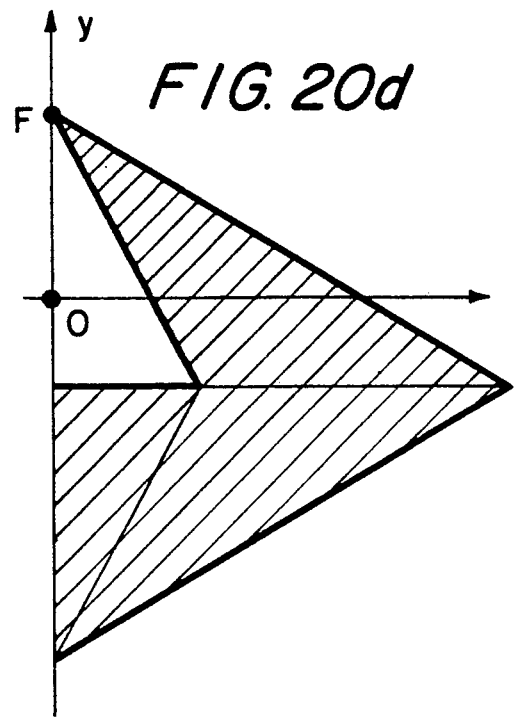
Figure 21:
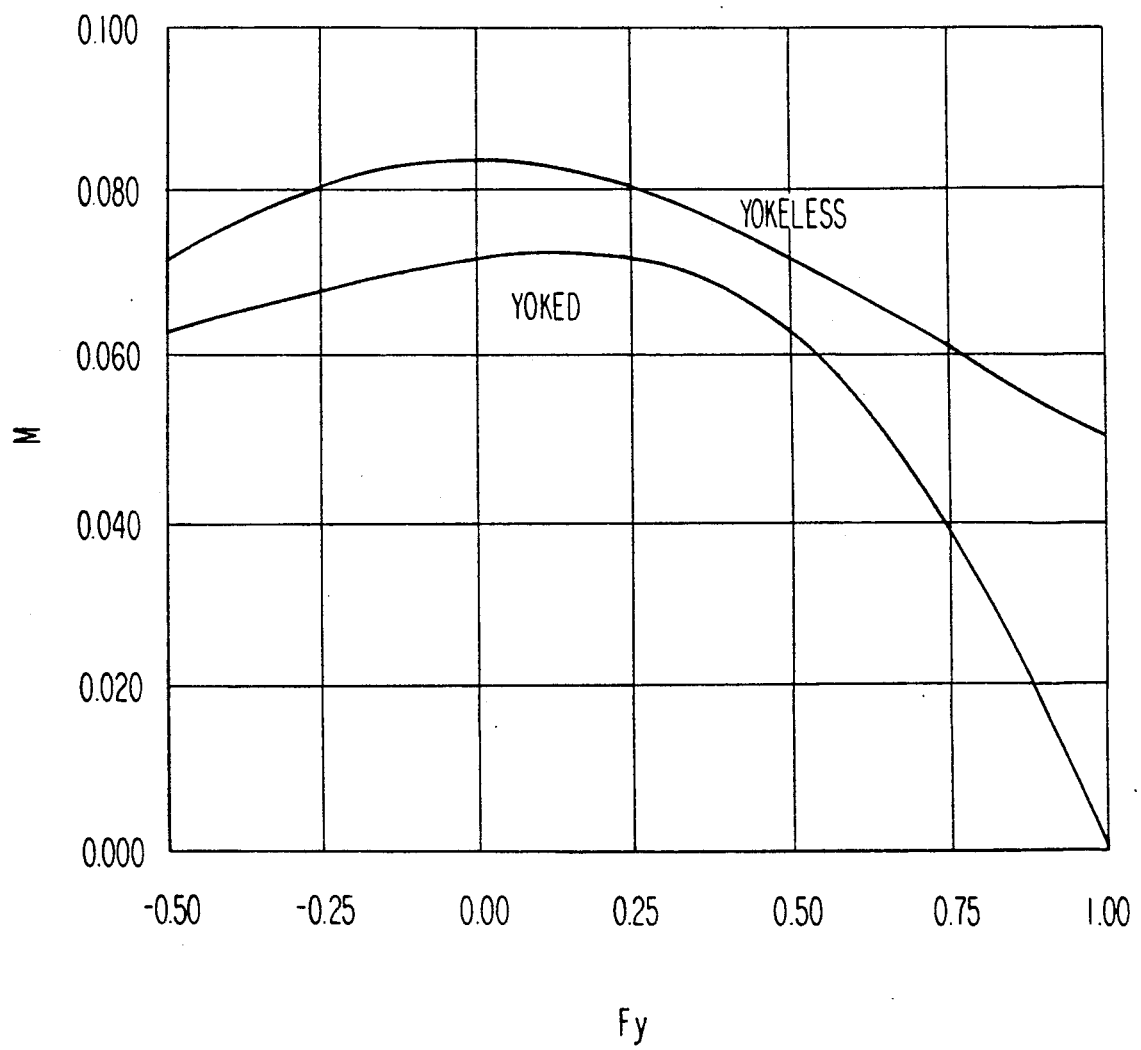
FIG. 21 is a graphical comparison of figures of merit of yoked and yokeless magnets with triangular cavities.

The magnet geometries for intermediate positions of point F are shown in FIGS. 19a and 19b. It is of interest to compare the geometries of FIGS. 17 to 19 with FIG. 20 which shows the yokeless magnets built around the same cavity for the same value $K=0.5$. The values of M versus the position of F for both designs are shown in FIG. 21. The triangular cavity is an example of cavity where the yokeless magnets have a higher figure of merit than the yoked magnets.

As the preceeding discussion suggests, an efficient use of the magnetized material can be achieved in a design where the air spaces between the components of a yoked magnet are eliminated and the components of a yokeless magnet that do not contribute to the field in the cavity are replaced by a high permeability medium designed to channel the flux of $\vec{B}$.

Figure 23:
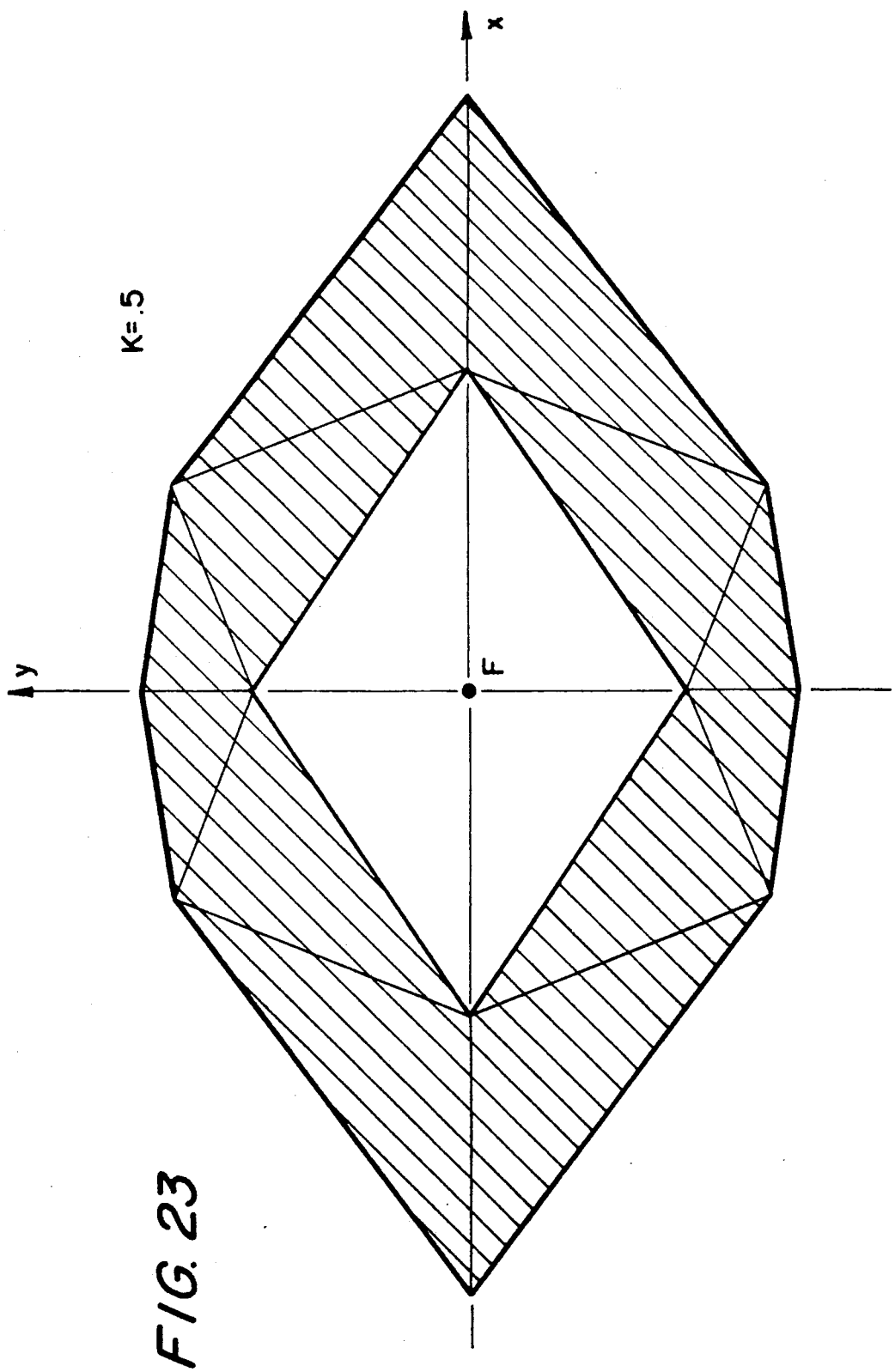
FIG. 23 is a representation of a yokeless magnet with rhombic cavity for K=0.5.
Figure 24:
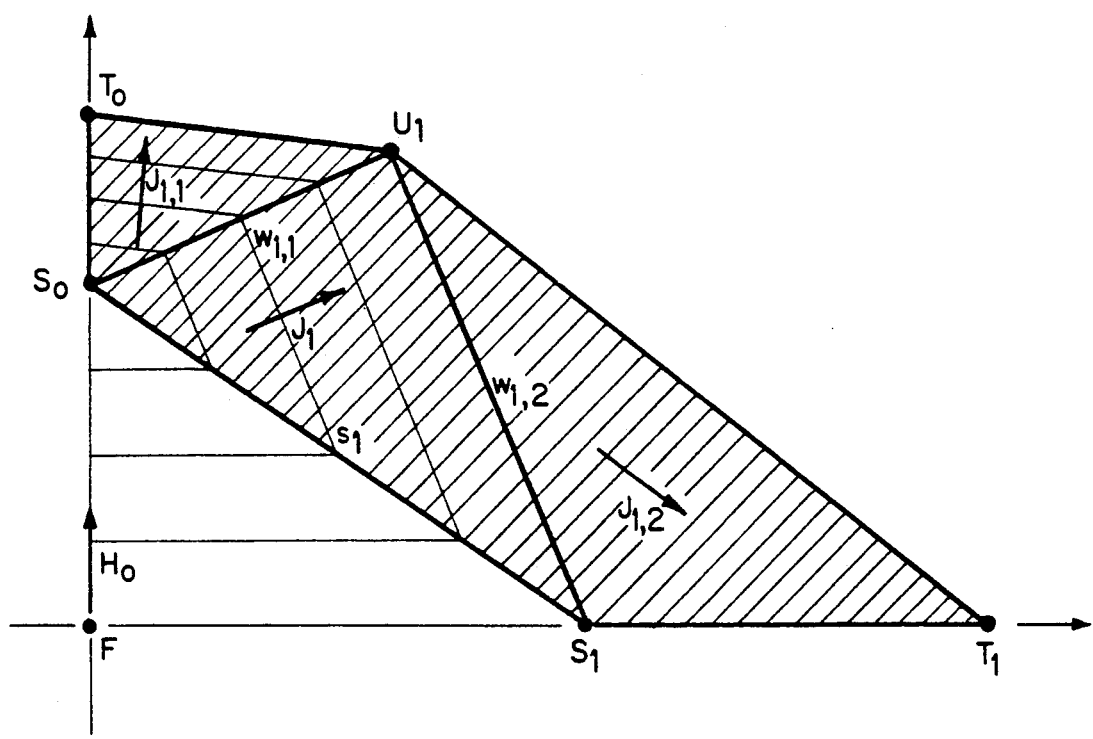
FIG. 24 shows a distribution of magnetization of equipotential lines in the magnet of FIG. 23.
Figure 25:
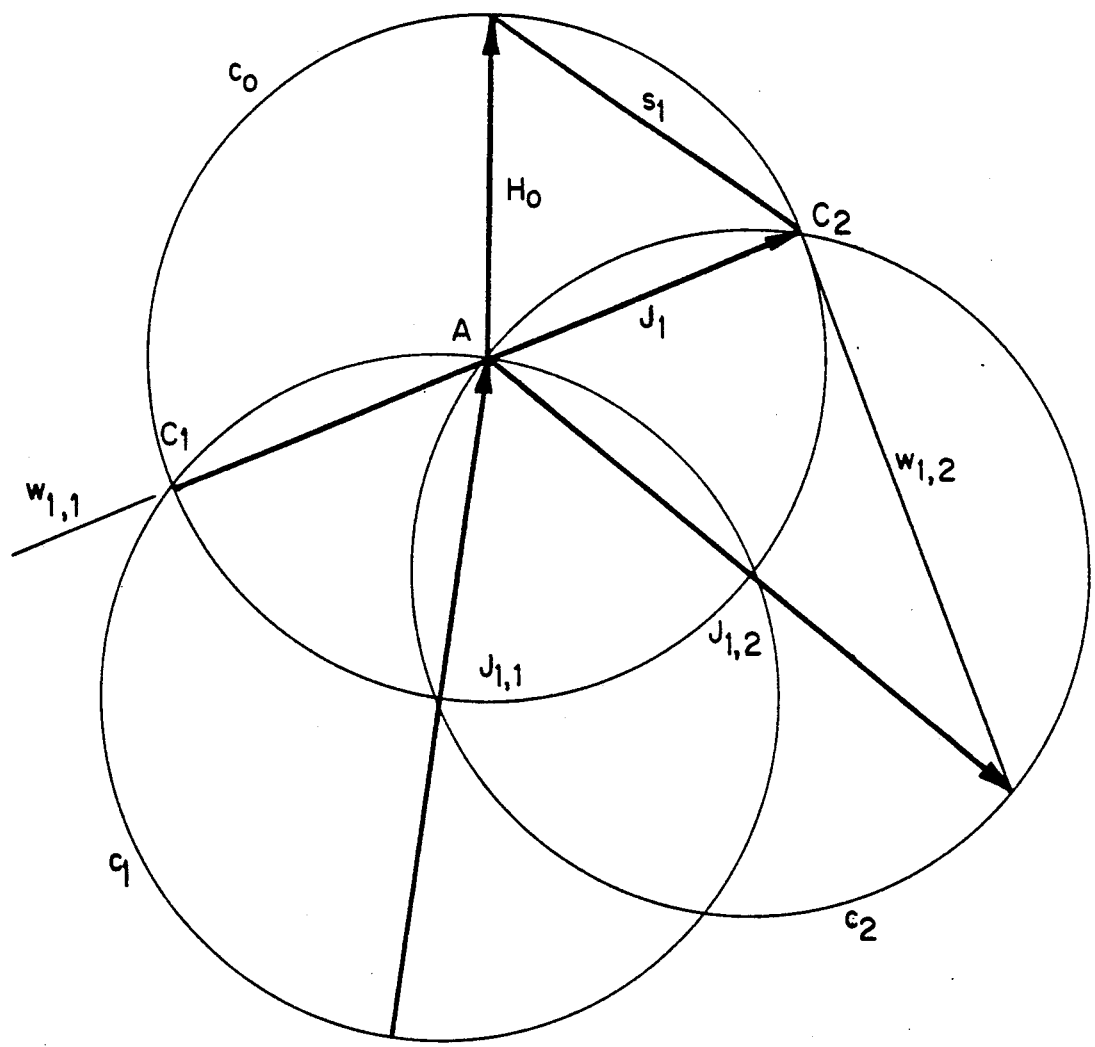
FIG. 25 is a vector diagram for the magnetization of the magnet of FIG. 23.

As pointed out previously, symmetric cavities yield optimum magnet design when F is located at the center of symmetry. Assume for instance the rhombic cavity shown in FIG. 23 with the ratio 3:2 of the diagonals along the x and y axes, and consider the single layer yokeless magnet design with point F located at the center of the rhombus. The magnet geometry of FIG. 23 corresponds to $K=0.5$ and a value of the figure of merit $M \sim 0.102$. The first quadrant of the magnet cross-section is shown in FIG. 24 with the equipotential lines corresponding to the orientation of $\vec{H}_0$ along the y axis. The values of the remanences and the field components in the three triangles of magnetized material in FIG. 24 are provided by the vector diagram of FIG. 25 which is the particular case of the diagram of FIG. 3 for $K=0.5$. One has $$\hat{J}_1 = 2\hat{B}_1 = -2\hat{H}_1.\hat{J}_{1,1} = -\hat{H}_{1,1}.\hat{J}_{1,2} = \hat{B}_{1,2}.$$ Eq.29

Thus, by selecting $\vec{H}_0$ oriented along the axis y and the line $\Phi = 0$ as the axis x, the magnetic induction is zero in the triangle ($S_0 T_0 U_1$) and the intensity of the magnetic field is zero in the triangle ($S_1 U_1 T_1$).

Figure 26:
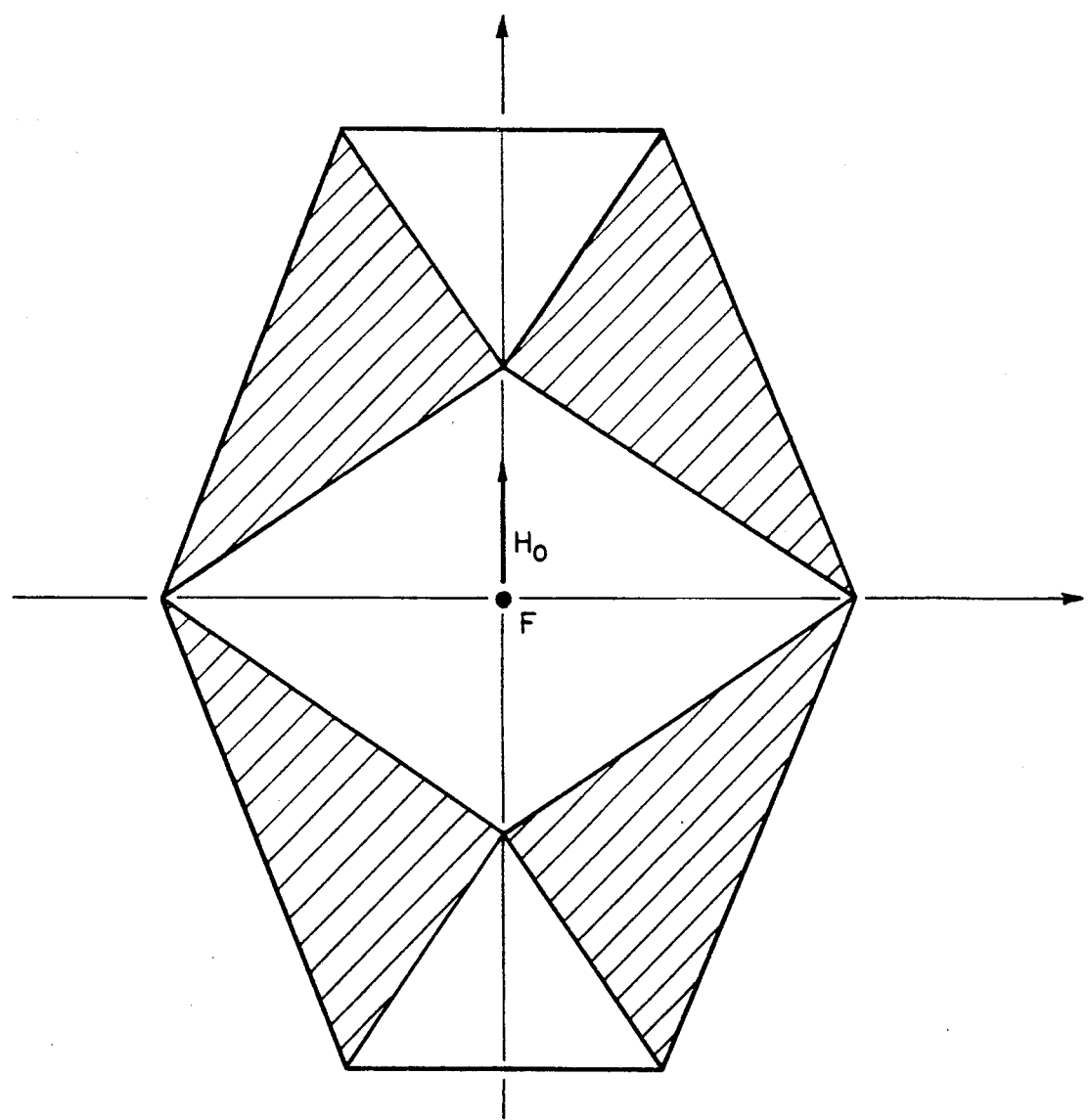
FIG. 26 is a representation of a yoked magnet with rhombic cavity for k=0.5.
Figure 27:
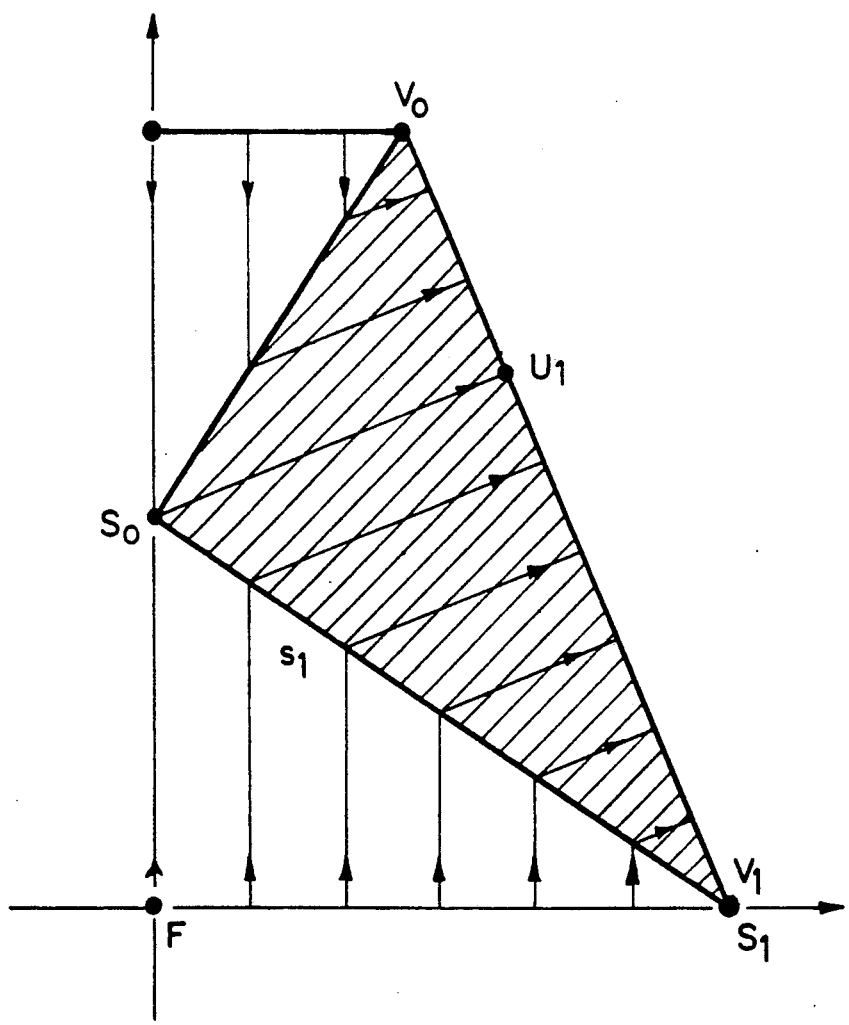
FIG. 27 shows lines of force of B in the magnet of FIG. 26.

Consider now the yoked magnet design around the same cavity with F located at the center of the rhombus and $\vec{H}_0$ oriented along the y axis. The magnet geometry for $K=0.5$ is shown in FIG. 26 and the first quadrant of the magnet cross-section is shown in FIG. 27 with the lines of force of the magnetic induction. $\vec{J}_1$ is the remanence of the right angle triangular cross-section of the magnetized material derived from the same vector diagram of FIG. 25. The line of force ($S_0 U_1$) divides the flux of $\vec{B}$ within the cavity from the flux of $\vec{B}$ within the triangular air gap between the magnetized components.

Obviously the figure of merit of the yokeless magnet remains unchanged and the yoked magnet exhibits the lowest value of M.

Figure 29:
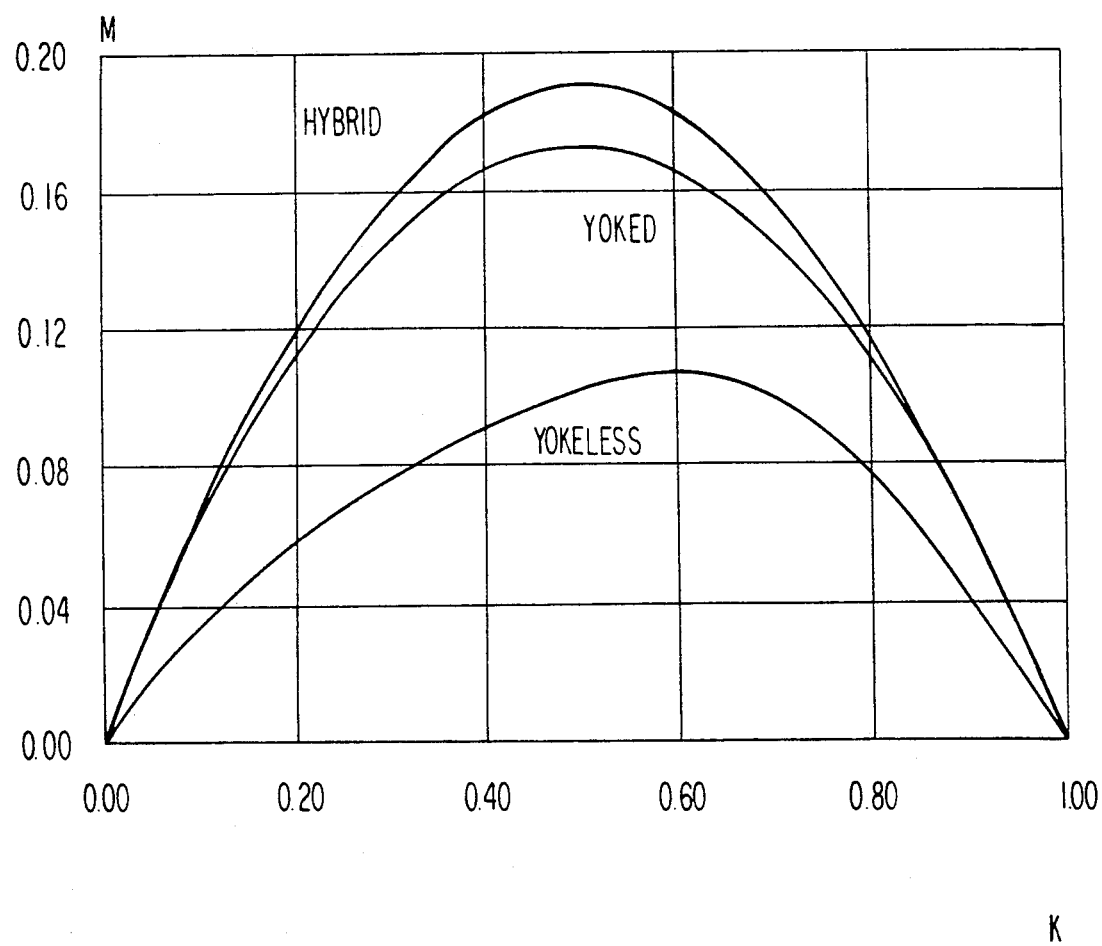
FIG. 29 is a comparison of figures of merit of yokeless, yoked and hybrid magnets with rhombic cavities.
Figure 31:
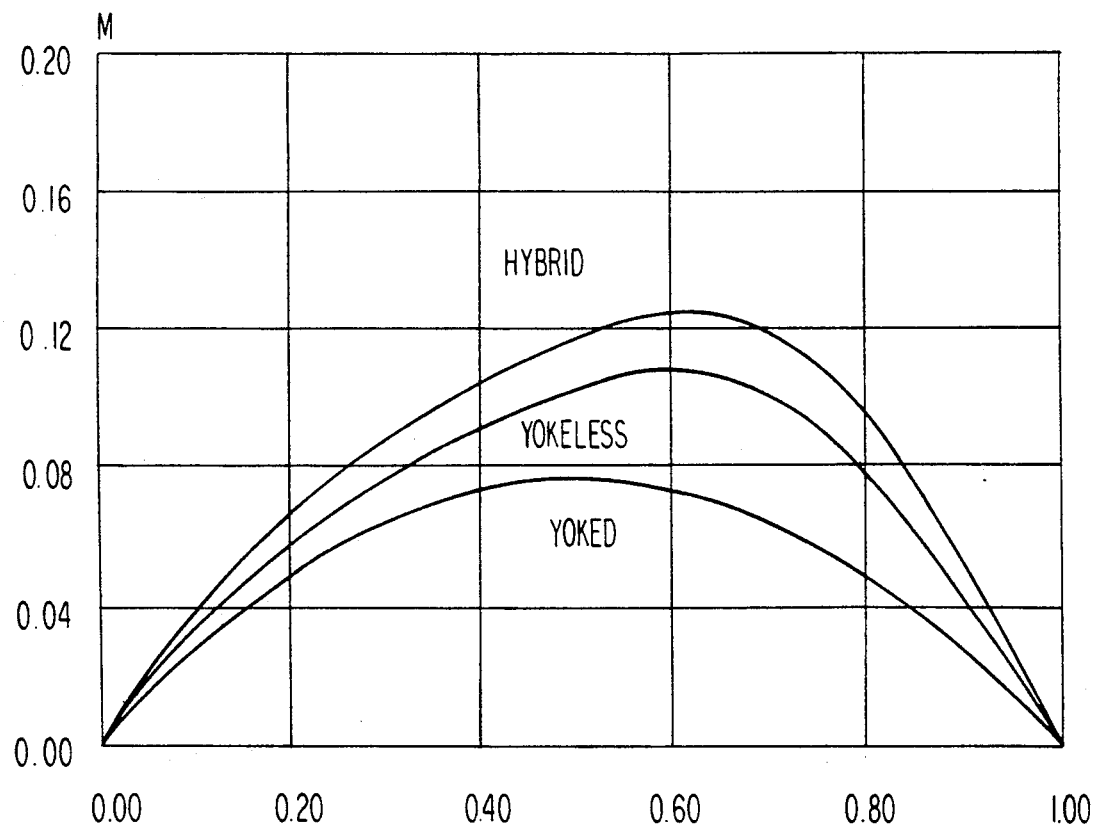
FIG. 31 shows the effect of a $\pi/2$ rotation of $H_0$ on the figure of merit.
Figure 33:
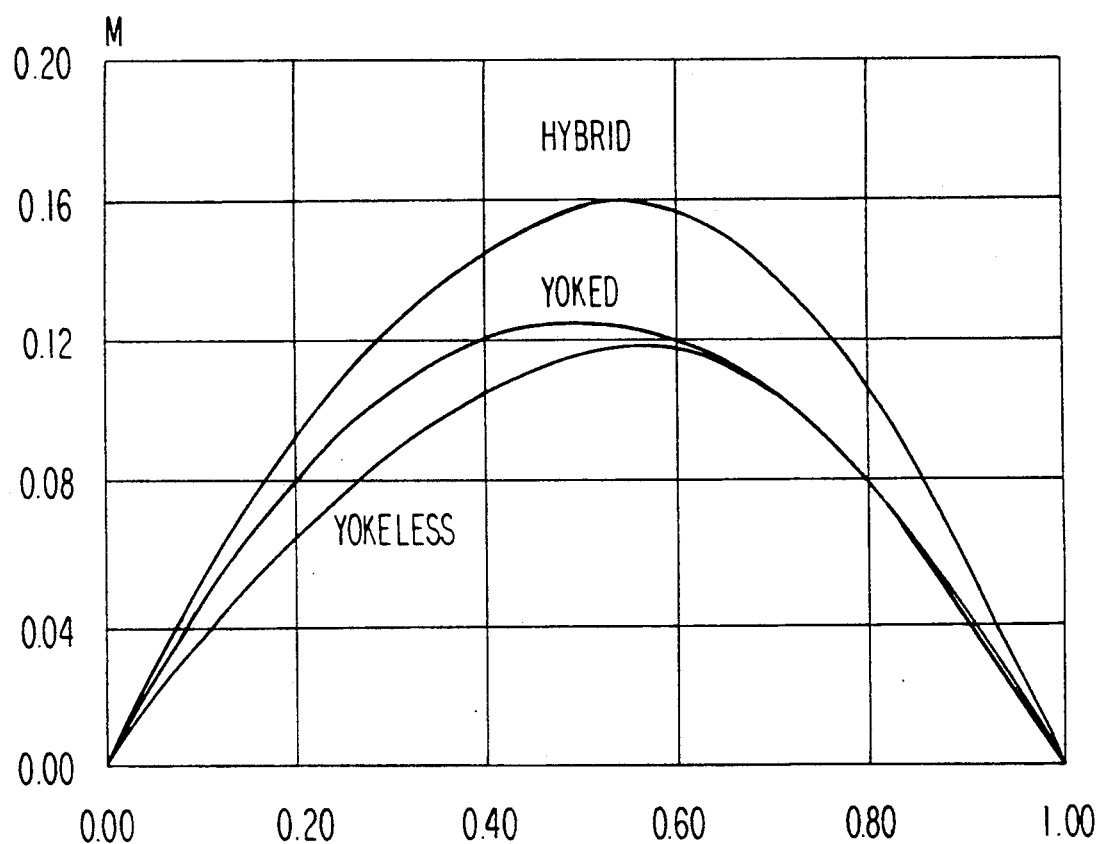
FIG. 33 is a graphical comparison of figures of merit of magnets with square cross-section.

In the particular case $x_0 = y_0$, i.e. when rhombus reduces to a square, the figure, of merit of these designs are given by FIG. 33. The difference between the yoked and the yokeless structures is less pronounced than in FIG. 29, but the hybrid structure always exhibits the largest value of M.

Figure 28:
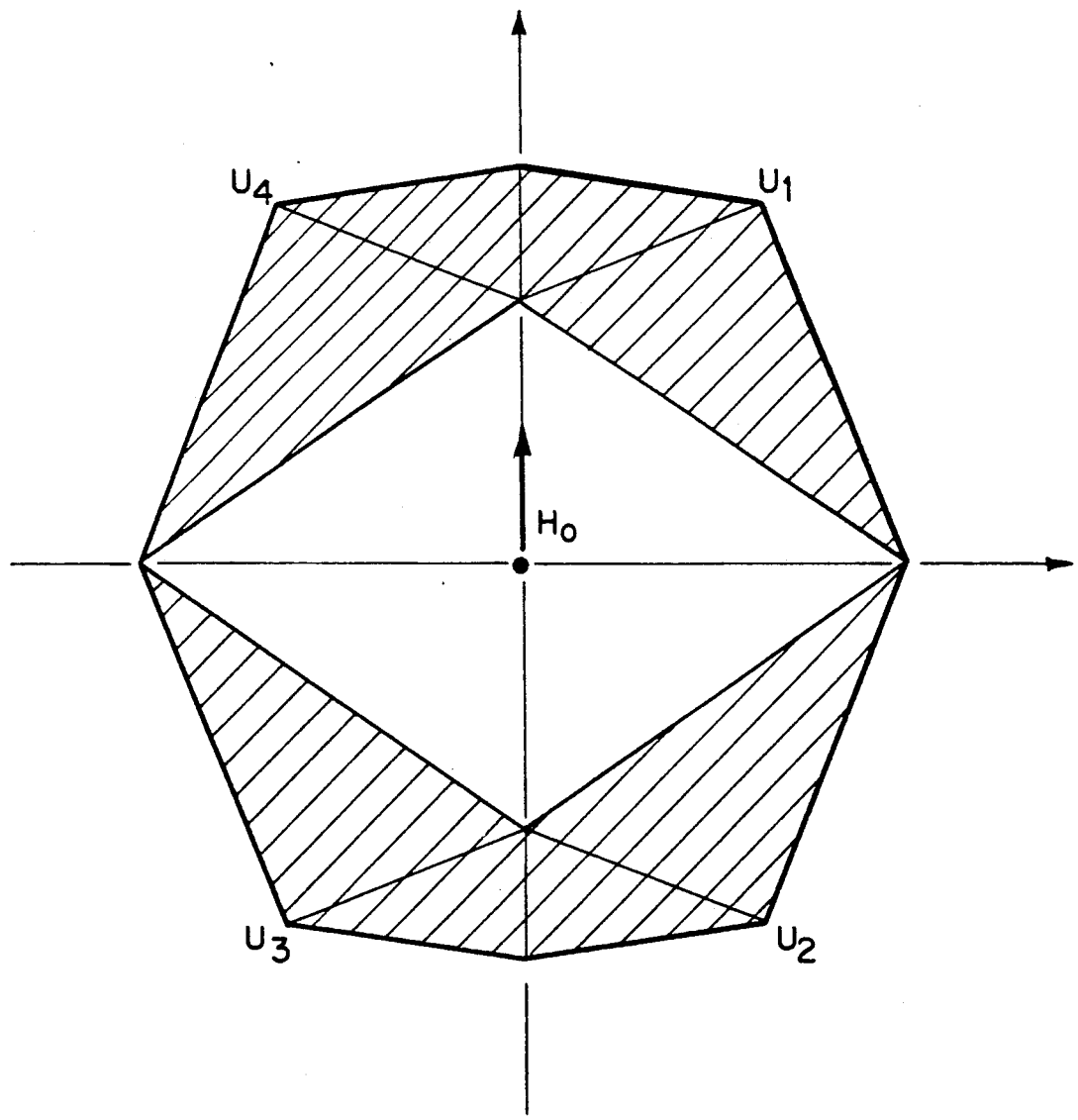
FIG. 28 represents hybrid magnet geometry for k=0.5.

The hybrid structure illustrated in FIG. 28 is a fully yoked magnet. In principle, the yoke between points $U_4$ and $U_1$ and the yoke between points $U_2$ and $U_3$ can be removed without perturbing the boundary conditions on the external surface of the magnetic structure. Thus the hybrid design approach may yield the partially yoked magnet of FIG. 34 where $W_1$ and $W_2$ schematically indicate the two high magnetic permeability regions of the partial yoke.

This paper has shown that a hybrid magnet design achieves a value of the figure of merit higher than the value of both yoked and yokeless designs. As a consequence, a hybrid design results in a minimum weight of the magnetized material compared to both yoked and the yokeless designs for the same geometry of the cavity and the same value of K.

The elimination of the air gaps between magnetized components, which characterize the yoked design, results also in a minimum volumes of the region occupied by the magnetic structure.

The yoke of a hybrid magnet is designed only for the flux of the magnetic induction which flows within the cavity of the magnet. Consequently the yoke required by a hybrid magnet weighs less than the yoke of the yoked magnet. Finally, the hybrid magnet does not require a full yoke totally enclosing the magnetic structure. The resulting partially yoked hybrid magnet makes it possible to interact with the field inside the cavity by means of external sources of electromagnetic field, as it is the case of yokeless configurations.

Figure 34:
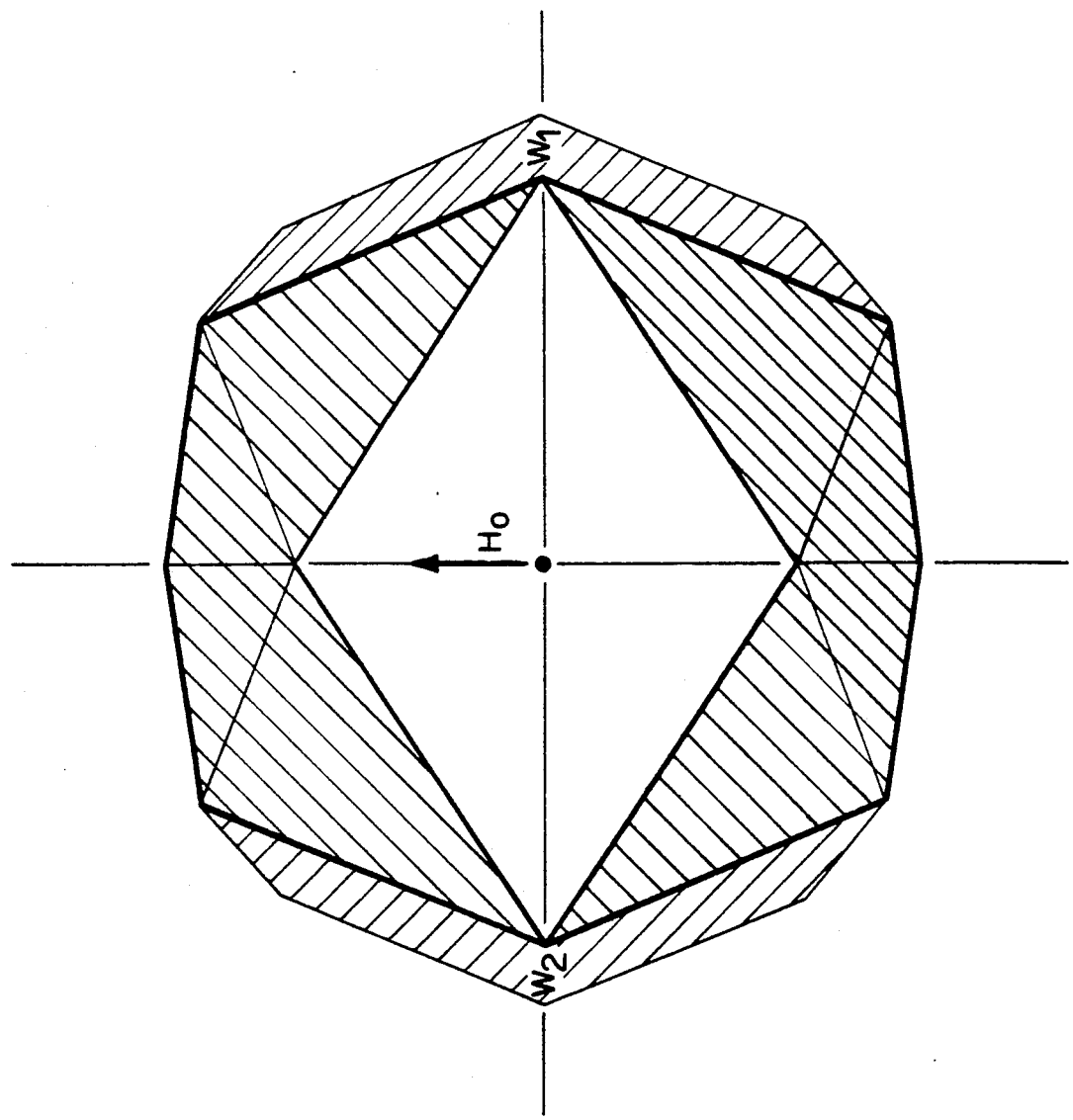
FIG. 34 is a schematic of a partially yoked magnet.

With reference to FIGS. 34 and 35, there is shown a three component magnetic hybrid structure operating in accordance with the present invention. The magnetic material includes uniformly magnetized prismatic permanent magnet sections, which may comprise, by way of example an alloy of Neodimium, Iron and Boron, in approximately a 30:65:5 ratio. The remanence of each section is shown by an arrow, and labelled $J_1$. The resultant circulating magnetic flux is labelled $H_o$. As shown, the configuration produces two major loops of circulating flux. The prismatic structure produces straight line borders of cross sectional surface, and a first group of sections, 12, 14, 16, 18 are employed to define a polygonal shaped cavity 20. Only the surfaces of the first group of sections form the cavity. A point F is defined on a line 22 of zero equipotential joining two vertices of the polygonal shaped cavity. Preferably, as shown, the polygonal contour is a regular polygon or otherwise ideally symmetric, and F is located at the center of symmetry. As explained previously, the design of the structure achieves a maximum value of M which corresponds to an optimum value of K and a minimum value of the ratio of the area of magnetized material to the area of the cavity, $A_m/A_c$.

A second plurality of uniformly magnetized prismatic permanent magnet sections 24, 26, 28 and 30, none of which interface with the cavity, are assembled with their respective borders aligned with adjacent sections of the first group. The respective remanances of each of these sections is as shown by the arrows labelled $J_2$.

Thus, the second plurality of sections serve to confine, without reduction, the magnetic field within the magnetic structure. As shown, two major loops of circulating flux are manifest; one to the left of F, moving counter clockwise and one to the right of F, moving clockwise. The respective remanences of each of the first sections thus cause the flux path H to result in a direction orthogonal to the base line 22, in the upward direction as shown. Each border of each section of either first or second plurality is ideally a zero equipotential line, as explained above, so that the total field is confined within the cavity and does not escape from the total structure.

For completing the loop, a third plurality of non magnetized magnetic sections 30 and 32 are provided. These are positioned with their respective borders enclosing the first sections 14, 18 and 12, 16, respectively, around the base line 22. These provide an inductive path to channel the flux and close the loop. The third plurality is preferably a soft iron or other suitable conventional yoke material. Its quantity is a function of the quantity and type of material employed for the permanent magnetized magnetic materials. Thus, where rare earth alloys are used, such as $N_dF_eB_o$, the amount of conventional yoke material such as iron will be equal to or less than the magnetized material it replaces.

Thus, whereas a yokeless magnet will normally require expensive rare earth materials to close the flux path, the geometric considerations of the present invention illustrate that for specific geometries, conventional yoke materials, costing significantly less than the equivalent rare earth materials may be substituted with an actual improvement in efficiency of operation.

Other geometric shapes may also be employed, and the specific shape shown in FIG. 34 and 35 is not considered the only possible but rather a preferable shape.

Other materials may also be substituted with varying effect on field strength, weight, size and costs. Thus, magnetized ferrite can be employed as the first and second plurality of sections, and non magnetized ferrite as the third plurality.

Other variations, modifications, additions, subtractions and deletions will be apparent to those skilled in the art, and the invention should be limited only to the scope of the appended claims.

What is claimed is:

1. A permanent magnet structure having at least one loop of circulating flux, comprising a first and second plurality of uniformly magnetized prismatic magnetic material sections forming a polygonal shaped cavity and having a point F positioned along a zero equipotential base line joining two vertices within said cavity, said point being the reference for a figure of merit M corresponding to a maximum field strength and a minimum ratio of the value of the area of magnetized material to the area of said cavity, said first plurality of sections totally defining said cavity and having their respective remanences aligned to result in a total flux path passing orthogonally through said base line, said second plurality of sections oriented with respect to their respective remanences and to said first sections so as to confine the flux within the cavity, and a third plurality of non magnetized magnetic sections enclosing said base line and bordering said first sections for providing an inductive path to channel said flux and close said loop.

2. The combination of claim 1 wherein each section of said third plurality of sections contain, by volume, an amount of material at least sufficient to be below saturation.

3. The combination of claim 1 wherein said first and second sections are high energy rare earth permanent magnetic material, the amount of yoke material in such a section being of the order of the amount of magnetized material it replaces.

4. The combination of claim 1 wherein said cavity is a regular polygon and said first plurality of sections defines two circulating flux loops.

5. A permanent magnetic structure comprising a first plurality of magnetized prismatic magnetic components arranged to form a cavity, the magnetic components oriented to concentrate a circulating magnetic flux in a closed loop along a given orientation along a path through said cavity, each of said magnetic components contributing to said flux, a second plurality of prismatic magnetized magnetic components, said second plurality positioned with respect to said first plurality and channeling said flux to close said path, and a third plurality of non magnetized magnetic components bordering said first plurality of components for providing an inductive path to channel said flux and to close said loop.

6. The combination of claim 5 wherein each section of said third plurality of sections contain, by volume, an amount of material at least sufficient to be below saturation.

7. The combination of claim 5 wherein said first and second section are high energy rare earth permanent magnetic material, the amount of the yoke material in such a section being of the order of the amount of magnetized material it replaces.

8. The combination of claim 5 wherein said cavity is a regular polygon and said first plurality of sections defines two circulating flux loops.

9. The combination of claim 1 wherein said first and second sections are high energy rare earth permanent magnetic material, the amount of yoke material in such a section being smaller than the amount of magnetized material it replaces.

10. The combination of claim 5 wherein said first and second section are high energy rare earth permanent magnetic material, the amount of the yoke material in such a section being smaller than the amount of magnetized material it replaces.

* * * * *